(12) United States Patent
Tombs et al.

(10) Patent No.: US 12,376,443 B2
(45) Date of Patent: Jul. 29, 2025

(54) PHOTOVOLTAIC STRUCTURES HAVING A COMPOSITE CONDUCTOR

(71) Applicant: Energy Materials Corporation, Rochester, NY (US)

(72) Inventors: Thomas Nathaniel Tombs, Rochester, NY (US); Scott Kenneth Christensen, North Chili, NY (US)

(73) Assignee: Energy Materials Corporation, Rochester, NY (US)

( * ) Notice: Subject to any disclaimer, the term of this patent is extended or adjusted under 35 U.S.C. 154(b) by 29 days.

(21) Appl. No.: 18/375,129

(22) Filed: Sep. 29, 2023

(65) Prior Publication Data

US 2024/0130145 A1   Apr. 18, 2024

Related U.S. Application Data

(60) Provisional application No. 63/411,892, filed on Sep. 30, 2022.

(51) Int. Cl.
*H10K 30/50*   (2023.01)
*H10K 30/10*   (2023.01)
(Continued)

(52) U.S. Cl.
CPC ............. *H10K 30/50* (2023.02); *H10K 30/10* (2023.02); *H10K 30/82* (2023.02); *H10K 30/85* (2023.02);
(Continued)

(58) Field of Classification Search
None
See application file for complete search history.

(56) References Cited

U.S. PATENT DOCUMENTS

| 8,907,258 B2 | 12/2014 | Schroder et al. |
| 9,340,697 B2 | 5/2016 | Sivarajan et al. |

(Continued)

FOREIGN PATENT DOCUMENTS

| CN | 104157789 A | 11/2014 |
| CN | 111430384 A | 7/2020 |

(Continued)

OTHER PUBLICATIONS

Song et al., Adv. Mater., 2022, 34, 2106805. (Year: 2021).*

(Continued)

*Primary Examiner* — Eli S Mekhlin
(74) *Attorney, Agent, or Firm* — Andrew J. Anderson, Esq.; Harter Secrest & Emery LLP

(57) ABSTRACT

A bifacial photovoltaic structure includes a transparent substrate, a perovskite absorber layer overlaying the substrate, a transparent first composite conductor interposed between the substrate and the perovskite absorber layer, and a transparent second composite conductor disposed over the perovskite absorber layer. The first composite conductor includes a first set of metal lines, and a first conducting layer provided in contact with the metal lines, wherein the first set of metal lines is characterized by a first set of dimensions and a first metallic composition. The second composite conductor includes a second conducting layer, and a second set of metal lines provided in contact with the second conducting layer, wherein the second set of metal lines is characterized by a second set of dimensions and a second metallic composition. The dimensions and/or compositions of the first and second composite conductors are different.

19 Claims, 7 Drawing Sheets

(51) Int. Cl.
*H10K 30/82* (2023.01)
*H10K 30/85* (2023.01)
*H10K 30/86* (2023.01)
*H10K 39/12* (2023.01)
*H10K 71/60* (2023.01)
*H10K 85/50* (2023.01)

(52) U.S. Cl.
CPC ............ *H10K 30/86* (2023.02); *H10K 39/12* (2023.02); *H10K 71/611* (2023.02); *H10K 85/50* (2023.02)

(56) References Cited

U.S. PATENT DOCUMENTS

| | | | |
|---|---|---|---|
| 9,803,097 B2 | 10/2017 | Bao et al. | |
| 9,868,875 B2 | 1/2018 | Rudhardt et al. | |
| 10,092,926 B2 | 10/2018 | Firth et al. | |
| 11,108,007 B2 | 8/2021 | Christensen et al. | |
| 11,202,369 B2 | 12/2021 | Zhamu et al. | |
| 11,342,130 B2 | 5/2022 | Christensen et al. | |
| 2007/0120095 A1* | 5/2007 | Gruner | D06M 23/08 252/500 |
| 2010/0229941 A1* | 9/2010 | Matsui | H01G 9/2031 438/85 |
| 2011/0008926 A1* | 1/2011 | Irvin | H10K 77/10 438/82 |
| 2011/0186112 A1 | 8/2011 | Aernouts et al. | |
| 2012/0055547 A1 | 3/2012 | Schultz-Wittmann et al. | |
| 2015/0206663 A1* | 7/2015 | Wijdekop | H10K 71/50 438/93 |
| 2015/0243812 A1 | 8/2015 | Hardin et al. | |
| 2017/0029646 A1 | 2/2017 | Hao et al. | |
| 2018/0261395 A1 | 9/2018 | Naka | |
| 2020/0377532 A1 | 12/2020 | Li et al. | |
| 2021/0313120 A1 | 10/2021 | Pazniak et al. | |
| 2021/0327654 A1 | 10/2021 | Miyamoto et al. | |
| 2021/0328162 A1 | 10/2021 | Fukuda et al. | |
| 2022/0025200 A1 | 1/2022 | Limage et al. | |
| 2022/0069146 A1 | 3/2022 | Hashmi | |
| 2022/0140269 A1 | 5/2022 | Hayakawa et al. | |
| 2022/0238807 A1 | 7/2022 | Christensen et al. | |
| 2022/0246865 A1 | 8/2022 | Dou et al. | |

FOREIGN PATENT DOCUMENTS

| | | |
|---|---|---|
| CN | 114447233 A | 5/2022 |
| KR | 10-2243519 B1 | 4/2021 |
| WO | 2021127654 A1 | 6/2021 |
| WO | 2024073046 A1 | 4/2024 |

OTHER PUBLICATIONS

Chen et al. (Jun. 2019) "Efficient Ni/Au Mesh Transparent Electrodes for ITO-Free Planar Perovskite Solar Cells" Nanomaterials 9(7):932, 1-13.

Chen et al. (Apr. 2020) "Blade-Coated Perovskites on Textured Silicon for 26%-Efficient Monolithic Perovskite/Silicon Tandem Solar Cells" Joule 4(4): 1-15.

Da Silva Filho et al. (2022) "A Review on the Development of Metal Grids for the Upscaling of Perovskite Solar Cells and Modules," Sol. RRL 6:2100865, 27 pages.

Vasilopoulou et al. (2020) "Molecular materials as interfacial layers and additives in perovskite solar cells," Chem. Soc. Rev. 49(13): 4496-4526.

Yao et al. (2016) "Light management in plastic-paper hybrid substrate towards high-performance optoelectronics," Energy Environ. Sci. 7(9): 2278-2285.

\* cited by examiner

PHOTOVOLTAIC STRUCTURES HAVING A COMPOSITE CONDUCTOR

CROSS-REFERENCE TO RELATED APPLICATIONS

This application claims priority to, and any other benefit of, U.S. Provisional Patent Application Ser. No. 63/411,892 entitled PHOTOVOLTAIC STRUCTURES HAVING A COMPOSITE CONDUCTOR, filed Sep. 30, 2022, the entire disclosure of which is fully incorporated herein by reference.

STATEMENT REGARDING FEDERALLY SPONSORED RESEARCH OR DEVELOPMENT

This invention was made with government support under DE-EE0008972 awarded by the Solar Energy Technologies Office, Department of Energy. The government has certain rights to the invention.

TECHNICAL FIELD

The present disclosure relates to perovskite photovoltaic devices having a transparent composite conductor, and in particular, to bifacial perovskite photovoltaic devices having multiple transparent composite conductors.

BACKGROUND

Since their first report in 2009, rapid improvements have enabled perovskite solar cells (PSCs) to become a promising technology for converting light to electricity as part of optoelectronic devices. To date, the power conversion efficiencies (PCEs) of solution-processed PSCs have been certified above 25 percent, which is higher than the current dominant photovoltaic technology based on multi-crystalline silicon. Whereas crystalline silicon is rigid, brittle, and requires costly, energy-intensive fabrication procedures, perovskites are flexible, easily processed at low temperatures, and up to a thousand times thinner. Furthermore, perovskites are solution-processable, which enables their manufacture with scalable, low-cost methods. These attributes open new opportunities to integrate solar power creatively and inexpensively into previously inaccessible markets, such as electric vehicles and buildings. PSCs also have the important advantage of maintaining acceptable PCE as the temperature increases, unlike silicon-based solar cells, which exhibit significant power loss in typical operating environments. The manufacturing and PCE advantages of PSCs have put them on the path to be the next generation technology for utility, commercial, and residential photovoltaic applications.

Most top performing PSCs reported in the literature have been fabricated by lab-scale, spin-coating methods, which are unsuitable for high throughput and scalable module production. Forming high-performing, uniform, and defect-free multilayer structures on flexible substrates to make PSCs in a cost-effective manner remains a great challenge. Some of this complexity is due to the complexity of depositing and drying a perovskite solution with high-speed production equipment, but other layers can be challenging as well. Some non-limiting factors to consider in the manufacture of multilayer PSCs may include the adhesion of one layer to another, the chemical compatibility of a coating solution with an underlying layer, thermal treatments and compatibility of such with other layers, surface energy or structures and their effect on coatability, layer flexibility, thermal expansion properties, and optical properties, just to name a few. High efficiency PSCs benefit from electrodes that have low electrical resistance and high optical transparency, but such electrodes can be difficult to produce at high manufacturing speeds in a manner compatible with other layers of the PSC. Low resistance electrodes are particularly desired for high area devices where photogenerated currents may need to travel a significant distance to current collectors or other device components. Higher resistance across a long path can result in an unacceptable power efficiency loss. The challenges are further heightened when both electrodes are transparent, such as in bifacial photovoltaic structures. Bifacial solar cells can receive light from the front or back and generate electricity.

Despite research into various approaches, PVs based primarily on perovskites have yet to make a large market impact due at least in part to some of the unresolved problems noted above.

SUMMARY

There remains a desire for PSC devices that can be reliably manufactured at large scale at low cost, have high PCEs, and that can be made having large sizes or surface areas without unacceptable power loss.

In accordance with an embodiment of this disclosure, a bifacial photovoltaic structure includes a transparent substrate and a first composite conductor overlaying the transparent substrate. The first composite conductor includes (i) a first set of metal lines and (ii) a first conducting layer provided in contact with the metal lines, wherein the first set of metal lines is characterized by a first set of dimensions and a first metallic composition. A first carrier transport layer overlays the first composite conductor, a perovskite absorber layer overlays the first carrier transport layer, a second carrier transport layer overlays the perovskite absorber layer and a transparent second composite conductor overlays the second carrier transport layer. The second composite conductor includes (i) a second conducting layer and (ii) a second set of metal lines provided in contact with the second conducting layer, wherein the second set of metal lines is characterized by a second set of dimensions and a second metallic composition. In some cases, at least one dimension of the first set of dimensions is different than a corresponding dimension of the second set of dimensions by greater than 20%. Alternatively, or in combination, the first metallic composition is different than the second metallic composition with respect to elemental composition or morphology.

The present disclosure provides for PV devices that may have one or more of the following advantages relative to conventional PV devices: improved PCE; lower resistance electrodes; electrodes with higher optical transparency; improved manufacturing scalability; simplified manufacturing process; reduced manufacturing defects; more reproducible manufacturing process; reduced environmental impact manufacturing process; increased physical durability or increased lifetime.

DETAILED DESCRIPTION

Figure 1:
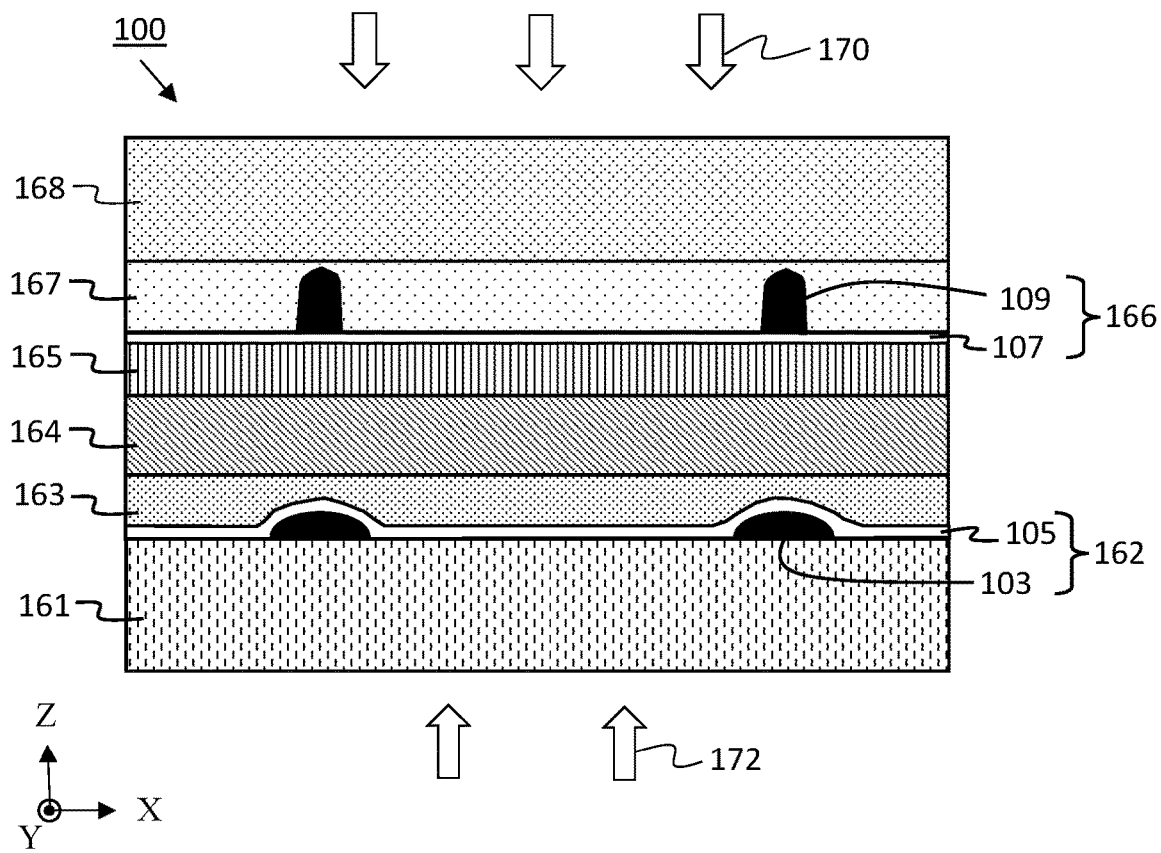
FIG. 1 is a cross-sectional view of a non-limiting example of a perovskite photovoltaic structure according to some embodiments.

It is to be understood that the drawings are for purposes of illustrating the concepts of the disclosure and may not be to scale. Terms like "overlaying", "over" or the like include, but do not necessarily require, direct contact (unless such direct contact is noted or clearly required for functionality). Additional details of certain embodiments of the present application may be found in U.S. Pat. Nos. 11,108,007, 11,342,130, U.S. Application Publication No. 2020/0377532, and U.S. Application Publication No. 2022/0238807, the entire contents of which are incorporated herein by reference for all uses.

A perovskite photovoltaic structure is intended to receive light (typically visible, IR, or UV light) and convert it into electricity. As such, various layers and features may need to be reasonably transparent to this light to ensure that an appropriate amount reaches the perovskite layer(s). Herein, unless otherwise noted, the terms "transparent", "transparency", "transmissive", "transmittance", or the like, are generally relative to the target wavelength or wavelength range for conversion to electricity. This target wavelength or wavelength range may be different for different systems. In some embodiments, the target wavelength range may correspond to the solar radiation spectrum or a portion thereof. In some cases, the target wavelength range may correspond to the visible light spectrum or a portion thereof. In some cases, the target wavelength range may correspond to the infrared or UV spectrum, or a portion thereof. In some embodiments, the target wavelength range may be defined as a particular wavelength, e.g., 400 nm, 450 nm, 500 nm, 550 nm, 600 nm, 650 nm, 700 nm, or 750 nm, or any other wavelength of interest in the IR, visible, or UV portions of the spectrum intended for energy conversion. In some cases, a target wavelength range may be defined as an explicit range, e.g., 400-425 nm, 425-450 nm, 450-475 nm, 475-500 nm, 500-525 nm, 525-575 nm, 575-600 nm, 600-625 nm, 625-650 nm, 650-675 nm, 675-700 nm, 700-725 nm, 725-750 nm, or any combination of ranges thereof, or any other wavelength range of interest.

In some embodiments, something (e.g., a layer, a component, a structure, or the like) that is "transparent" transmits at least 50% of incident radiation within the target wavelength range, i.e., a transmittance (% T) of 50%. Something that is considered light transmissive generally transmits at least 10% of incident radiation within the target wavelength range. Transmittances in the range of 10% up to 50% may be considered partially transparent. A light-transmissive component, layer, or structure may be either transparent or partially transparent.

Besides the light-absorbing properties of a layer, a component, a structure, or the like, its apparent transparency may in some cases be affected by refractive index mismatches, surface structures, or other factors that may result in reflective losses and/or light scattering. Another way to describe transparency is in terms of absorptance (% A). In some embodiments, something that is "transparent" may have an absorptance of 50% or less with respect to incident radiation within the target wavelength range. Something that is considered light transmissive may have an absorptance of 90% or less of incident radiation within the target wavelength range. Absorptances in a range of 50% up to 90% may be considered partially transparent.

FIG. 1 is a cross-sectional view of a non-limiting example of a perovskite photovoltaic structure according to some embodiments. For added perspective, XYZ coordinate axes are also shown. The photovoltaic 100 may include a transparent substrate 161, which may in some cases be flexible. A transparent first composite conductor 162 may be provided overlaying the transparent substrate 161. The first composite conductor may include a first set of conductive metal lines 103 and a first conducting layer 105 provided in contact with the first set of metal lines. In some preferred embodiments and as shown in FIG. 1, the first set of conductive metal lines 103 may be provided over the transparent substrate 161 and the first conducting layer 105 may be provided over the first set of metal lines and over the transparent substrate. Although illustrated as a conformal coating, the first conducting layer may in some cases act as a smoothing layer and may partially or fully planarize the structure. In some other embodiments, not shown, the first conducting layer may instead be provided over the transparent substrate and the first set of metal lines provided over the first conducting layer.

A first carrier transport layer 163 may be provided overlaying the first composite conductor. Although illustrated as planarizing, the first carrier transport layer may in some cases be a conformal coating or partially planarizing. In some preferred embodiments, the first carrier transport layer 163 is generally not in direct contact with the first set of metal lines 103. A perovskite absorbing layer 164 (sometimes referred to herein simply as a perovskite layer) may be provided overlaying the first carrier transport layer. A second carrier transport layer 165 may be provided overlaying the perovskite absorbing layer.

A transparent second composite conductor 166 may be provided overlaying the second carrier transport layer. The second composite conductor may include a second conducting layer 107 and a second set of conductive metal lines 109 provided in contact with the second conducting layer. In some preferred embodiments, the second set of metal lines are generally not in direct contact with the second carrier transport layer 165. That is, and as shown in FIG. 1, the second conducting layer may be provided over the second carrier transport layer and the second set of conductive metal lines may be provided over the second conducting layer. In some other embodiments, not shown, the second set of metal lines may be provided over the second carrier transport layer and the second conducting layer may be provided over the second set of metal lines and over the second conductive layer.

In some embodiments, the photovoltaic structure may optionally include a transparent adhesion layer 167 provided over the second composite conductor 166. In some cases, the second set of metal lines may be substantially embedded within the adhesion layer 167. Adhesion layer 167 may in some cases have planarizing properties, act as an encapsulation layer, or both. In some embodiments, 167 may be referred to as an encapsulation layer that in part functions to reduce the ingress of water or other materials to improve device lifetime. In some cases, the photovoltaic structure may optionally include a transparent superstrate 168 provided over adhesion layer 167. In some embodiments, the transparent superstrate may be flexible. In some cases, the adhesion layer 167 may be first applied over the second composite conductor and the transparent superstrate may be adherently applied over the adhesion layer. In some embodiments, the adhesion layer 167 is pre-applied to the superstrate 168 and that assembly may be laminated over the second composite conductor.

The layers between the first and second composite electrodes shown in FIG. 1 may sometimes be referred to herein as photovoltaic "active layers". Although not illustrated in FIG. 1, in some embodiments, one or more interfacial layers may optionally be provided between any adjacent active layers, between an active layer and an electrode, over the second composite electrode or under the first composite electrode. Herein the term "interfacial layer" is used broadly, with the purpose, e.g., of altering one or more properties of the interface between two layers such as changing the work function, increasing the barrier properties to mobile ions, passivating defects in a neighboring layer, or altering the band gap. In some cases, an interfacial layer may more specifically act as a barrier to diffusion of water, solvents, molecules, ions (e.g., metal ions and/or halide ions). In some embodiments an interfacial layer may passivate, deactivate or otherwise ameliorate unwanted trap states or carrier transport barriers at layer interfaces or even grain boundaries. An interfacial layer may in some embodiments include a generally electrically insulating metal oxide (e.g., aluminum oxide, titanium dioxide, or the like) that is sufficiently thin so as not to seriously impede the transport of charge between layers. In some embodiments, an interfacial layer may be less than 6 nm, alternatively less than 2 nm. In some cases, an interfacial layer may be a few monolayers thick, alternatively a single monolayer thick. In some cases, an interfacial layer may be a continuous layer or film, but in other cases may be discontinuous. In some embodiments, an interfacial layer may be applied by an inline tool compatible with roll-to-roll manufacturing. In some cases, an interfacial layer may be applied by spatial ALD (SALD), a reduced pressure metal oxide deposition tool, or coating (or other contact) with a solution, liquid, gas, or aerosol that includes an interfacial material. Additionally, anywhere the phrase "interfacial layer" or similar concepts appear herein, they may be replaced by "interfacial treatment". In some cases, an interfacial treatment may not result in deposition of an interfacial layer but may instead treat a layer at its surface or even internally to provide the desired treatment result.

Photovoltaic structure 100 may in some cases be a bifacial photovoltaic structure capable of receiving light 170 from its upper surface and light 172 from its lower surface. In some embodiments, light 170 may be more intense than light 172. For example, light 170 may include sunlight and light 172 may include reflected sunlight or some other ambient light source.

In operation, positive and negative charges (holes and electrons) are produced in the perovskite absorbing layer 164 in response to absorption of appropriate radiation. The first and second carrier transport layers (163, 165) receive these separated charges and transfer them to the respective first and second composite conductors (162, 166). The first and second composite conductors may be in electrical contact with an electrical device (not shown in FIG. 1) where the collected charges serve to power the device, or alternatively charge it in the case where the electrical device is an energy storage battery of some sort.

In some embodiments, the first carrier transport layer may include a hole transporting material and the first composite conductor may act as an anode in the photovoltaic structure. In such embodiments, the second carrier transport layer may include an electron transporting material and the second composite conductor may act as a cathode in the photovoltaic structure. Such an arrangement of layers may for convenience be referred to as a PIN structure.

In some alternative embodiments, the first carrier transport layer may include an electron transporting material and the first composite conductor may act as cathode in the photovoltaic structure. In such embodiments, the second carrier transport layer may include a hole transporting material and the second composite conductor may act as an anode in the photovoltaic structure. Such an arrangement of layers may for convenience be referred to as a NIP structure.

In some embodiments, the materials and methods used for forming one or more layers of the photovoltaic structure are compatible with high-speed manufacturing. In some cases, one or more layers may be formed using roll-to-roll processes. In some embodiments, one or more manufacturing steps may instead use batch deposition methods or a series of substrates in a "cut sheet" format, e.g., with each mounted in a frame.

Transparent Substrate

The transparent substrate is generally electrically insulating and may be formed from any suitable transparent material(s) such as a glass, a polymer (plastic), or a combination of different materials. The transparent substrate may in some cases be rigid, but in preferred embodiments, the transparent substrate is flexible. Some non-limiting examples of transparent substrates may include thin flexible glass such as Corning® Willow® Glass, a polyethylene terephthalate (PET) (which may optionally be a heat-stabilized PET), a polyethylene naphthalate (PEN), a polycarbonate (PC), a polysulfone (PS), a polyether sulfone (PES), a polyamide, p-nitrophenylbutyrate (PNB), a polyetherketone (PEEK), a polyetherimide (PEI), a polyarylate (PAR), a polyvinyl acetate, a polyimide, a cyclic olefin polymer (COP), a cellulose triacetate (TAC), a polyacrylate, or an epoxide. For some applications, some particularly useful transparent substrates include thin flexible glass, PET and heat-stabilized PET. The transparent substrate may optionally include multiple materials or have a multilayer structure. The transparent substrate may include a surface treatment to modify the surface energy for improved coating quality and/or adhesion of subsequent layers. Some non-limiting examples of surface treatments include corona discharge, ozone (created, for example, with ultraviolet radiation), and plasma. Surface treatment devices may operate in ambient air, conditioned air (where temperature and relative humidity are controlled), oxygen, or inert gas such as nitrogen or argon.

In some embodiments, a surface-modifying treatment may involve a wet chemical treatment or even an additional surface layer deposited by a wet- or dry-coating method. In some cases, a surface layer may be referred to as a primer layer. In some cases, the transparent substrate may act as a water vapor or oxygen barrier, e.g., through choice of substrate material or by addition of one or more barrier layers.

Note that by "flexible" it is generally meant that the material can undergo some shape changes at least in one dimension in response to some force or stress without significant damage. In some cases, flexibility of a substrate or material may be measured by its bend radius, which is the minimum radius that it can be bent without functionally damaging it. In some embodiments, a flexible transparent support may have a bend radius of less than 100 cm, alternatively less than 50 cm, 20 cm, 10 cm, 5 cm, 4 cm, 3 cm, 2 cm, or 1 cm. In some preferred embodiments, a flexible transparent substrate may have a bend radius of less than 10 cm.

There are no particular limitations on the thickness of the substrate if flexibility is not desired, so long as it remains sufficiently transparent. In some preferred embodiments, a flexible transparent substrate is suitable for roll-to-roll manufacturing and may have a thickness of less than about 350 μm if it is flexible glass (e.g., a thickness in a range of 50 to 350 μm), or alternatively less than about 200 μm if it is a flexible plastic (e.g., a thickness in a range of 20 to 250 μm). The transparent substrate preferably has a transmittance (% T) of at least 80%, or more preferably 90%. Alternatively, the transparent substrate preferably has an absorptance (% A) of less than 20%, or more preferably, less than 10%.

First and Second Carrier Transport Layers

As mentioned, one carrier transport layer includes a hole transporting material, and the other carrier transport layer includes an electron transporting material. A carrier transport material that includes a hole transporting material may be referred to as a hole transport layer. In addition to transporting holes, a hole transporting material may also effectively block the transport of electrons. A carrier transport material that includes an electron transporting material may be referred to as an electron transport layer. In addition to transporting electrons, an electron transporting material may also effectively block the transport of holes. In some embodiments, a carrier transport layer may include multiple layers of materials. A non-limiting example of a multilayer charge transport layer may include embodiments where one sublayer is especially for transporting the desired charge and another sublayer especially for blocking the opposite charge. In some cases, a blocking sublayer may be adjacent to the perovskite blocking layer. The thickness of a carrier transport layer depends in part on the properties of the overall photovoltaic stack, but in some embodiments, may have an average thickness in a range of 10's to 100's of nanometers.

Some non-limiting examples of hole-transporting materials may include a poly(triaryl amine) (e.g., poly[bis(4-phenyl)(2,4,6-trimethylphenyl)amine]), a poly-(N-vinyl carbazole), PEDOT complex, a poly(3-hexylthiophene), spiro-MeOTAD (also known as $N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine), poly-TPD, EH44, certain metal oxides (e.g. nickel oxide, molybdenum oxide, and vanadium oxide, any of which may optionally be doped), copper thiocyanate and copper iodide, and certain self-assembled monolayers (e.g. 2-(9H-Carbazol-9-yl)ethyl]phosphonic acid)

Some non-limiting examples of electron-transporting materials may include fullerenes, (e.g., phenyl-C61-butyric acid methyl ester (PCBM) and fullerene-C60), bathocuproine (BCP), TPBI, PFN, $PC_{71}BM$, ICBA, graphene, reduced graphene oxide, certain metal oxides (e.g., tin oxide, zinc oxide, cerium oxide, and $TiO_2$, any of which may optionally be doped).

Depending in part upon the particular material, a carrier transport layer may in some cases be deposited by a dry deposition process. Some non-limiting examples of dry processes may include sputtering, thermal evaporation, physical vapor deposition, chemical vapor deposition, atomic layer deposition, e-beam deposition, or some other process that may in some cases operate under reduced pressure. In some cases, dry deposition may be performed inline in a roll-to-roll system, e.g., by using spatial ALD (SALD) or a reduced pressure material deposition (RPMD) tool. Such RPMD tools operate at pressures above normal vacuum deposition systems, e.g., in a range of 0.01 mBar to 200 mBar. In some embodiments, a carrier transport layer may be deposited from an aerosol of nanoparticles. Some non-limiting examples of aerosol-based deposition are described in US10092926, which is incorporated by reference herein in its entirety for all purposes. In some cases, aerosol deposition has been found to be less damaging to underlying device layers.

In some embodiments, a carrier transport layer may be deposited by a coating process that does not require reduced pressure. Some non-limiting examples of coating processes may include gravure, slot die, spray, dip coat, inkjet, flexographic, rod, or blade coating methods. In some cases, a coating process may be followed by a thermal treatment to drive off solvent, anneal the carrier transport material, or the like.

In some embodiments, a carrier transport layer may be deposited by transfer of the carrier transport material from a donor sheet, e.g., by application of heat or some other stimulus to release it from the donor sheet with adherent transfer to the appropriate device layer or substrate.

In some cases, the deposition method is suitable for high-speed manufacturing. In some embodiments, the deposition of one or more carrier transport layers may be performed using a roll-to-roll manufacturing process.

Perovskite Absorbing Layer

Perovskite materials and methods for forming perovskite absorbing layers may be as described in U.S. Pat. Nos. 11,108,007, 11,342,130, U.S. Application No. 2020/0377532, and U.S. Application Publication No. 2022/0238807, the entire contents of which are incorporated herein by reference. In some embodiments, a perovskite absorbing layer may be coated from a fluid mixture, which may be referred to as a perovskite solution. Any coating method suitable for coating a fluid mixture may be used including, but not limited to, gravure, slot die, spray, dip coat, inkjet, flexographic, rod, or blade coating methods. In some cases, the perovskite deposition method is suitable for high-speed manufacturing. In some embodiments, a perovskite absorbing layer may be performed using a roll-to-roll manufacturing process.

The term "perovskite solution" refers to a solution or colloidal suspension that can be used to generate a continuous layer of organic-inorganic hybrid perovskite material (the perovskite absorber layer), e.g., one with an $ABX_3$ crystal lattice where 'A' and 'B' are two cations of very different sizes, and X is an anion that coordinates to both cations. A perovskite solution typically includes an appropriate set of perovskite precursor materials and one or more solvents in which the precursor material is dissolved or suspended. A perovskite solution may also contain additives, e.g., to aid in crystal growth or to modify crystal properties or for some other purpose. A perovskite precursor material is typically an ionic species where at least one of its constituents becomes incorporated into the final perovskite layer $ABX_3$ crystal lattice. Organic perovskite precursor materials are materials whose cation contains carbon atoms while inorganic perovskite precursor materials are materials whose cation contains metal but does not contain carbon.

When the perovskite solution dries, perovskite crystals or an intermediate precursor phase for hybrid perovskite crystals (intermediate phase) form. The intermediate phase is a crystal, adduct, or mesophase that is not the desired final crystal lattice, which is $ABX_3$. The intermediate phase, if present, may be converted to the desired final crystal lattice by annealing. In some cases, annealing or other heating methods may include the use of heated nip rollers, optionally under nitrogen.

Some non-limiting examples of inorganic perovskite precursor materials for making perovskite solutions may include lead (II) iodide, lead (II) acetate, lead (II) acetate trihydrate, lead (II) chloride, lead (II) bromide, lead nitrate, lead thiocyanate, tin (II) iodide, rubidium halide, potassium halide, and cesium halide. In some cases, the halide may include iodide. Some non-limiting examples of organic perovskite precursor materials for making perovskite solutions may include methylammonium iodide, methylammonium bromide, methylammonium chloride, methylammonium acetate, formamidinium bromide, and formamidinium iodide. To produce a high-performance perovskite device, it is generally preferred in some cases that the organic perovskite precursor material has a purity greater than 99 percent by weight and the inorganic perovskite precursor has a purity greater than 99.9 percent by weight. The inorganic perovskite precursor material contains a metal cation, and in some preferred embodiments, the metal cation is lead. In some preferred embodiment, the molar ratio of organic perovskite precursor material to inorganic perovskite precursor material may be in a range of one to three.

In some cases, a perovskite solution may be formulated using a large proportion of a low boiling point solvent (e.g., at least 50 wt. % of total solvent, preferably at least 75 wt. % of total solvent, more preferably at least 90 wt. % of total solvent). In some embodiments, a low boiling point solvent is one having a boiling point of less than 150° C., or preferably less than 135° C. Such proportions may assist or enable high speed production of a uniform perovskite layer. Using an appropriate drying method, a low boiling point solvent can be made to evaporate quickly from the perovskite solution after deposition on a substrate thus minimizing movement of the crystals that form as the perovskite solution dries. Solvents that do not strongly coordinate with the perovskite precursors further enable short annealing times. Short annealing times are desirable because they enable higher production speeds. Alcohol-based solvents have been identified that do not strongly coordinate with the perovskite precursors, can provide the proper solubility of the inorganic precursors, and have been shown to produce a perovskite solution that can be stable for use in high volume manufacturing of perovskite layers and photovoltaic devices. Some non-limiting examples of alcohol-based solvents suitable for use at high proportions in the perovskite solution may include 2-methoxyethanol, 2-ethoxyethanol, 2-butoxyethanol, 2-isopropoxyethanol, methanol, propanol, butanol, and ethanol. Mixtures of solvents are envisioned for use in the perovskite solution to tune the evaporation profile to further optimize the drying process. Some non-limiting examples of suitable solvent additives useful for modifying evaporation rate of the solvent may include dimethylformamide, acetonitrile, dimethyl sulfoxide, N-methyl-2-pyrrolidone, dimethylacetamide, gamma-butyrolactone, phenoxyethanol, acetic acid, and urea.

In some preferred embodiments, a perovskite solution may be formulated with greater than 30 wt. % of solvent (e.g., 30-82 wt. %) and at least 18 wt. % of solids (e.g., 18-70 wt. %, preferably 25-60 wt. %, or 30-45 wt. %), where the total solids concentration of the perovskite solution is in a range of 30-70% by weight of its saturation concentration at the provided solution temperature. In some preferred embodiments, a solution temperature may be in a range of 20-50° C. In some preferred embodiments, the solvent is an alcohol and has a boiling point less than 135° C. In some preferred embodiments, the solvent is 2-methoxyethanol, which has a boiling point of 125° C. In some embodiments, such formulations may provide perovskite solutions that are stable at convenient handling and storage temperatures (e.g., in a range of 20-50° C., and in particular, room temperatures in a range of 20-25° C.), and which can be used to manufacture uniform perovskite layers at high speed, thereby enabling low-cost production of high efficiency solar cells with low equipment costs.

Although uniform perovskite layers have been made at high production speeds with the above formulations, it has sometimes been found that the time required for the perovskite solution to form homogeneous nuclei and grow may be longer than the time required to evaporate the low boiling point solvent in such a way as to produce a uniform perovskite layer. A uniform perovskite layer with optimum sized crystals is desired to make perovskite devices with high photovoltaic energy output. Addition of a crystal growth modifier added to a perovskite solution having a low boiling point solvent has been found to improve the performance of perovskite photovoltaic devices. A crystal growth modifier refers to an additive that either alters the amount of time for homogeneous crystal growth or alters the rate of homogeneous crystal growth when drying a perovskite solution. Some non-limiting examples of crystal growth modifiers that are especially useful in perovskite solutions for making high performance perovskite layers include dimethyl sulfoxide, N-methyl-2-pyrrolidone, gamma-butyrolactone, 1,8-diiodooctane, N-cyclohexyl-2-pyrrolidone, water, dimethylacetamide, acetic acid, cyclohexanone, alkyl diamines, and hydrogen iodide. In some preferred embodiments, the concentration of a crystal growth modifier may be less than about 10% by weight of the coating solution (e.g., in a range of 0.01-10% wt.). In some cases, a more preferred concentration of crystal growth modifier may be less than about 2% by weight of the coating solution (e.g., 0.01 to 2% wt.).

Another additive for a perovskite solution that may improve the performance of perovskite devices is a crystal grain boundary modifier. A crystal grain boundary modifier refers to an additive that improves the quality of the grain boundary, for example, be altering the electrical properties of the perovskite crystal grain boundary or reducing trap states at perovskite crystal grain boundary interfaces. Some non-limiting examples of crystal grain boundary modifiers that can be particularly useful in perovskite solutions for making high performance perovskite layers include choline chloride, phenethylamine, hexylamine, 1-α-phosphatidyl-choline, polyethylene glycol sorbitan monostearate, sodium dodecyl sulfate, Poly(methyl methacrylate), Polyethylene glycol, pyridine, thiophene, ethylene carbonate, propylene carbonate, fullerenes, poly(propylene carbonate), and didodecyldimethylammonium bromide. A preferred concentration of crystal grain boundary modifier may be less than about 10% by weight of the coating solution (e.g., in a range of 0.01-10% wt.). In some cases, a more preferred concentration of crystal growth modifier may be less than about 2% by weight of the coating solution (e.g., 0.01 to 2% wt.).

In some embodiments, particularly in NIP structures, a multifunctional capping layer may be provided between the perovskite absorber layer and the hole transport carrier layer, e.g., as described in US20220246865, which is incorporated by reference herein in its entirety for all purposes. A multifunctional capping layer may include a thiophene-containing molecule functionalized with an ammonium group. A non-limiting example is 2-(3''',4'-dimethyl-[2,2':5', 2'':5'',2'''-quaterthiophen]-5-yl)ethan-1-ammonium iodide.

Transparent Composite Conductors

The composition and methods for forming each transparent composite conductor may be individually selected from a similar set of material and coating technology options as described herein. However, in some preferred embodiments, the second composite conductor is generally different in some way relative to the first composite conductor besides its location in the photovoltaic structure stack. As discussed below, some of these differences may be with respect to material selection, a physical dimension, the deposition method, transmittance (% T), absorptance (% A), or the like. Nevertheless, despite these differences, it is also preferred in some embodiments (including, but not limited to, embodiments where a plurality of perovskite photovoltaic structures or cells are connected in series) that the average sheet resistance of the first composite conductor be similar to the average sheet resistance of the second composite conductor. In some embodiments, the ratio of the average sheet resistance of the first composite conductor to the average sheet resistance of the second composite conductor may be in a range of 0.2 to 5, alternatively 0.5 to 2, alternatively 0.6 to 1.7, alternatively 0.7 to 1.4, alternatively 0.8 to 1.25, or alternatively 0.9 to 1.1. As discussed elsewhere herein, due in part to the composite nature of the conductor, the term "sheet resistance" may refer to a functional sheet resistance that depends not only upon the intrinsic resistivities of the metal lines and the conducting layer, but may also depend upon the geometries of the metal lines and the intended direction of current flow across the composite conductor.

The transparency of a composite conductor depends on the width of the metal lines (which are mostly opaque), the transparency of the conducting layer, may also depend in part on the layers adjacent the composite conductors, e.g., on their index of refraction. In some embodiments, a transparent composite conductor may have a % T within a target wavelength range of at least 50%, or alternatively, at least 55%, 60%, 65%, 70%, 75%, 80%, 85%, 90%, or 95%. In some cases, a composite electrode may (within a target wavelength range) have a % T in a range of 50-55%, 55-60%, 60-65%, 65-70%, 70-75%, 75-80%, 80-85%, 85-90%, 90-95%, or 95-98%, or any combination of ranges thereof. The apparent transparency of a transparent conductor may in part depend on adjacent layers.

In some embodiments, a composite conductor may have a % A within a target wavelength range of less than 50%, or alternatively less than 45%, 40%, 35%, 30%, 25%, 20%, 15%, 10%, or 5%. In some cases, the top electrode may (within a target wavelength range) have a % A in a range of 5-10%, 10-15%, 15-20%, 20-25%, 25-30%, 30-35%, 35-40%, 40-45%, or 45-50%, or any combination of ranges thereof.

Higher % T and lower % A values are usually favored, but other system factors (conductivity, manufacturing cost, device stability, etc.) may also be considered such that a composite electrode may not have the highest possible % T or lowest possible % A, but rather have an effective % T or % A for overall device performance.

In some embodiments, as described below, the second composite conductor may have a higher % T (or lower % A) than the first composite conductor. Alternatively, the first composite conductor may have a higher % T (or lower % A) than the second composite conductor. In some embodiments, the % T (or % A) of the first and second composite conductors may be about the same, e.g., within 1% of each other.

Metal Lines

There is no particular limitation on the metal material that may be used for the metal lines. In some embodiments, the metal lines may include silver or copper, or alloys containing one or both of these metals. In some cases, other metals may be suitable including, but not limited to, gold, aluminum, molybdenum, tungsten, zinc, nickel, iron, tin, palladium, platinum, titanium, and alloys containing one or more of these metals. In some embodiments, the metal lines may be formed of a metal material having a conductivity of at least $10^5$ S/m.

In some embodiments, metal lines may be deposited using a dry metal deposition process coupled with some patterning process. For example, metal lines may be deposited by thermal evaporation, sputtering, physical vapor deposition, chemical vapor deposition, atomic layer deposition, e-beam deposition, or the like. Patterned metal lines may be formed, for example, by deposition through a shadow mask or by using known photolithographic methods that may involve etching and/or lift-off processes. In some embodiments, a metal layer may be electrochemically or electrolessly deposited and then patterned into metal lines, for example, by photolithography. In some embodiments, metal lines may be deposited by transfer of prepatterned metal lines from a donor sheet to the intended surface, optionally in combination with heat and/or pressure.

In some embodiments, metal lines may be formed by printing. In some embodiments, printing may involve patterned application of an electroless metallization catalyst (e.g., palladium) followed by contact with an electroless plating solution (e.g., copper or nickel). In some preferred embodiments, metal lines may be printed using a metal-containing fluid mixture or "metal ink" (e.g., a suspension, slurry, paste, or the like). In some cases, printing metal lines may be performed by flexographic printing, inkjet printing, gravure printing, or some other printing technology. The printed metal lines may in some cases be followed by a heat treatment to drive off solvent or cause metal particles to fuse or sinter, which can increase the metal conductivity. Heat treatments may include an oven, IR heaters, flashlamps, heated rollers (with or without pressure), or the like. US8907258, incorporated herein by reference for all purposes, discloses a non-limiting example of a pulsed radiation apparatus that may be suitable for metal particle sintering in a roll-to-roll manner. In some cases, a printed metal ink may be subjected to a secondary chemical treatment such as a reducing agent. The metal ink may include metal particulates of various shapes and sizes (e.g., spherical, oblong, nanoparticles, nanowires) in an appropriate liquid carrier and may further include other agents such as binders, surfactants, or the like. A few non-limiting examples of metal inks may include those disclosed in US20220025200, which is incorporated herein by reference for all purposes.

In some embodiments, a surface receiving the metal ink may first be treated to modify its surface energy, e.g., by corona discharge, a plasma, UV/ozone, or a chemical treatment. Modification of this surface energy can in some cases be used to control the shape, dimension, and/or adhesion of the deposited metal ink.

The particular set of metal materials and patterning methods may be different for the first set of metal lines 103 relative to the second set of metal lines 109. For example, when forming the first set of metal lines 103, substrate 161 may have a relatively wide tolerance for ink solvents, plating, photolithography, heat treatments, surface treatments, and the like. However, when forming the second set of metal lines 109, the conducting layer 107 and underlying charge transport and perovskite layers may have a lower tolerance for these materials and treatments. In some embodiments, the second set of metal lines may be preferably formed using technology other than photolithography or plating.

Conducting Layers

In some embodiments, one or both conducting layers may include a conductive polymer material such as PEDOT:PSS, a poly(pyrrole), a polyaniline, a polyphenylene, or a poly(acetylene). Conductive polymers may be applied by a coating from a suspension or solution, e.g., using any of the coating methods described above with respect to the perovskite absorbing layer. After coating, the conducting layer may optionally be subjected to heating or some other drying step to drive off solvent or otherwise improve conductivity properties of the conductive polymer.

In some embodiments, one or both conducting layers may include high aspect ratio metal nanowires (e.g., silver nanowires) or carbon nanotubes. Such materials may be coated from a dispersion (optionally with a binder) at a density sufficient to form an interconnected, conductive mesh, but low enough to maintain transparency. After coating, the conducting layer may optionally be subjected to heating or some other drying step to drive off solvent or otherwise improve conductivity properties of the metal nanowires or carbon nanotubes.

In some preferred embodiments, one or both conducting layers may include doped or undoped metal oxides such as tin oxide (e.g., doped with indium or fluorine), molybdenum oxide, and zinc oxide (e.g., doped with aluminum). Such metal oxides are sometimes referred to as transparent conductive oxides (TCOs). TCOs may in some cases be coated from a suspension of metal oxide particles or formed from a sol-gel precursor solution, typically followed by a heating step to drive off solvent and anneal or sinter the metal oxide particles. TCOs may in some cases be deposited using dry deposition methods such as sputtering, physical vapor deposition, chemical vapor deposition, atomic layer deposition, e-beam deposition, or the like. In some preferred embodiments, a TCO may be deposited from an aerosol of nanoparticles (also considered a dry process). Some non-limiting examples of aerosol-based deposition are described in US10092926, which is incorporated by reference herein in its entirety for all purposes. In some cases, aerosol deposition may be less damaging to underlying device layers. A heating step may optionally follow such dry deposition processes, e.g., to improve conductivity of the deposited layer.

In some preferred embodiments, the conducting layer may be interposed between the metal line and a charge carrier layer. Such an arrangement has been found to reduce migration of metal and/or halide ions into the active portion of the perovskite photovoltaic structure. Such migration may cause degradation of performance over time. In some particularly preferred embodiments, the interposing conducting layer includes a TCO as described previously, e.g., indium-doped tin oxide (ITO) or aluminum doped zinc oxide (AZO). The TCO conducting layer may act as a barrier layer to diffusion of the metal and/or halide ions.

In some embodiments, the applied conducting layer may have an intrinsic sheet resistance (i.e., as measured in the absence of metal lines) of less than 1000 Ω/square, preferably less than 300 Ω/square. In some embodiments, the conducting layer may have an intrinsic sheet resistance in a range of 200 to 1000 Ω/square. While lower resistance is generally favored, in some embodiments, this range provides a practical balance of resistance with optical transparency. In some embodiments, the conducting layer may have a % T within a target wavelength range of at least 80%, alternatively at least 90%, at least 95%, or at least 97% (as measured in the absence of the metal lines). In some embodiments, the second conducting layer may have an absorptance % A within a target wavelength range of less than 20%, alternatively, less than 10%, less than 5%, or less than 3%.

The thickness of a conducting layer depends in part on the electrical and optical properties of the selected material and may also depend on the deposition method. In some embodiments, the conducting layer may have a thickness of less than 500 nm, alternatively less than 200 nm, alternatively less than 100 nm, alternatively less than 50 nm, alternatively less than 20 nm, or alternatively less than 10 nm. In some embodiments, the conducting layer may be an aerosol-applied TCO having an average thickness in a range of 30 nm to 100 nm. When a conducting layer is applied over a set of metal lines, the average thickness may correspond to areas between the metal lines. When applied over metal lines, it is desirable in many cases that the conducting layer also substantially covers the metal lines to help ensure electrical continuity and prevent or reduce migration of metal ions into the active layers. In some cases, a surface energy modifying treatment may be applied to the substrate and first set of metal lines to assist in adhesion and/or uniform deposition of the first conducting layer over both the substrate and the metal lines.

Metal Line Patterns

Figure 2A:
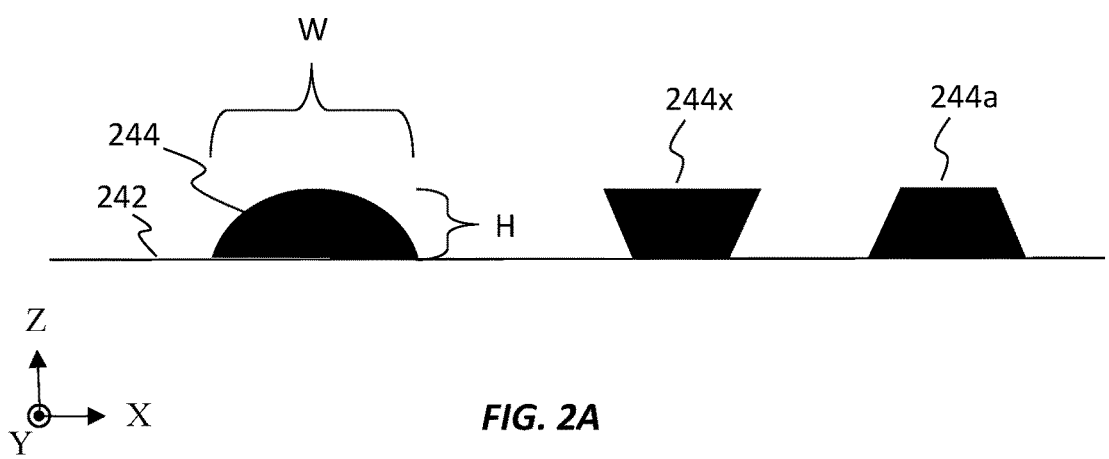
FIG. 2A is a cross-sectional view of non-limiting examples of metal lines according to some embodiments.

FIG. 2A is a cross-sectional view of non-limiting examples of metal lines according to some embodiments. Metal line 244 may be provided on a surface 242. A metal line may be characterized in cross section by a height H (or thickness) and width W. Height H and width W may be measured at a particular point or may be reported as an average height H and average width W along a metal line. In some embodiments, the height or width may vary along the length of a metal line.

Surface 242 may correspond to the surface of a substrate when metal line 244 is part of the first set of metal lines. Alternatively, surface 242 may correspond to the upper portion of the second conducting layer when metal line 244 is part of the second set of metal lines. Metal line 244 may take on a variety of shapes and sizes. In FIG. 2A, metal line 244 is shown to have a hemispherical shape in cross-section, but such a shape is not limiting. In some embodiments, in particular for the first set of metal lines, it may be less preferred to use metal line structures such as metal line 244x where the top of the metal is wider than the base thereby creating an overhang. This may create electrical discontinuities when depositing the first conducting layer over the first set of metal lines, particularly when the first conducting layer is substantially thinner than the metal line. Even a substantially vertical sidewall (e.g., a square or rectangular shape in cross section) may in some cases result in electrical discontinuities or areas of metal that are not covered such that the first conducting layer cannot act as an effective metal ion barrier. In some preferred embodiments, the cross-sectional shape of the metal line may have sidewalls that generally slope inwardly toward the middle of the line, e.g., as shown in metal line 244a or even 244. Although shown as symmetrical, the cross-sectional shape may not be symmetrical.

Figure 2B:
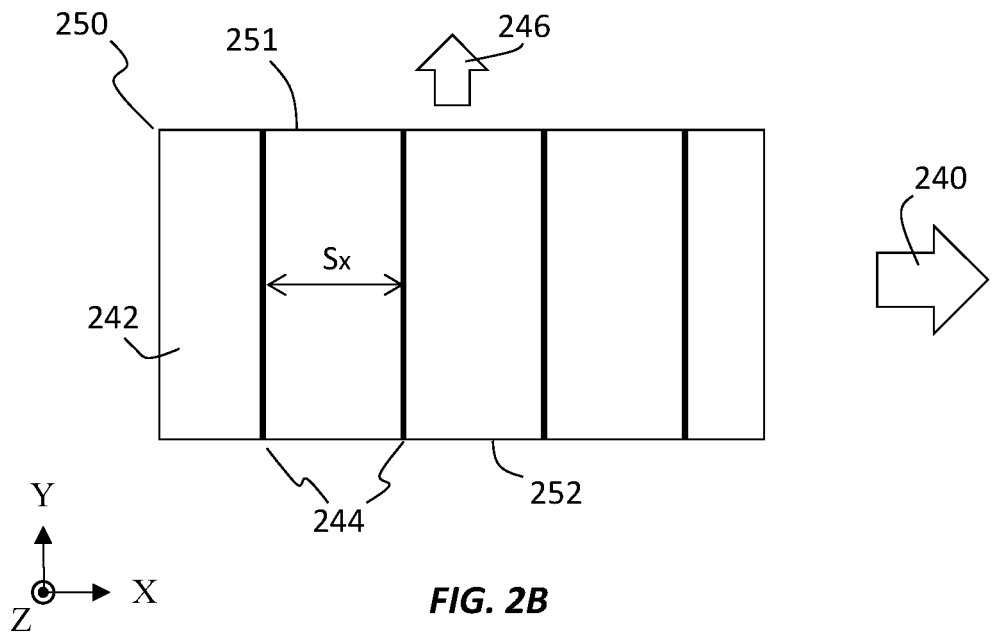
FIG. 2B is a top view of a non-limiting example of a set of metal lines according to some embodiments.

FIG. 2B is a top view of a non-limiting example of a set of metal lines according to some embodiments. As with FIG. 2A, surface 242 may correspond to the surface of a substrate when the set of metal lines 244 represents the first set of metal lines. Alternatively, surface 242 may correspond to the upper portion of the second conducting layer when the set of metal lines 244 represents the second set of metal lines. In some cases, the metal lines may be provided by roll-to-roll coating as discussed, and arrow 240 may correspond to the direction of web conveyance. Alternatively, arrow 240 may correspond to the direction of a cut sheet conveyance. The set of metal lines may be characterized by an average spacing $S_x$. In some preferred embodiments, the metal lines may be substantially parallel to each other and uniformly spaced. "Substantially parallel lines" may refer to non-intersecting lines that, relative to a common axis along a length dimension, generally align within 30 degrees of each other, alternatively within 15 degrees, 10 degrees, 5 degrees, 3 degrees, 2 degrees, or even within 1 degree. "Uniformly spaced" may refer to an average standard deviation of the spacings that is less than about 20% of an average spacing. The metal lines may be substantially parallel to the Y axis in FIG. 2B. When using roll-to-roll coating, such metal lines may be advantageously provided having a direction substantially orthogonal to the web conveyance direction, e.g., when using flexographic printing methods for the metal lines. In some cases, however, the metal lines may be provided at a different angle, or at various angles. Similarly, in some cases, the spacing may not be uniform. Although shown as straight lines, the metal lines could include some curvature or a zig-zag pattern.

In operation, positive or negative charges may generally flow in a direction 246, substantially parallel to the set of metal lines, to a first edge 251 of cell 250 where the current may be collected by a bus line or transferred in series to an adjacent cell (not shown). Although not shown, the opposite charges may flow in the direction opposite of arrow 246 to the second edge 252 of cell 250 to be collected by a bus line or transferred in series to an adjacent cell.

Figure 2C:
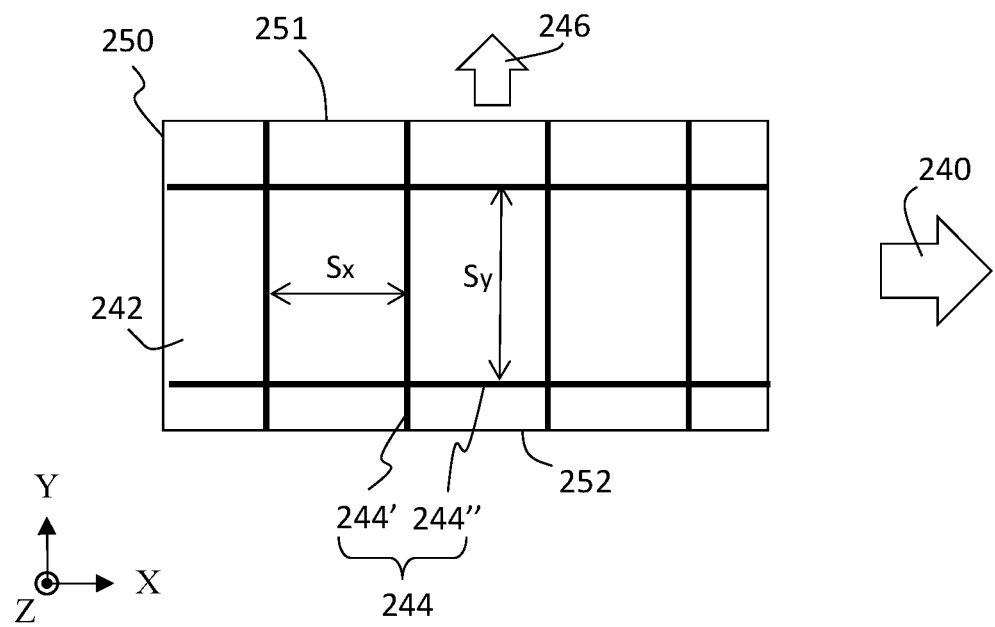
FIG. 2C is a top view of a non-limiting example of a set of metal lines according to some embodiments.

FIG. 2C is a top view of a non-limiting example of a set of metal lines according to some embodiments. FIG. 2C is similar to FIG. 2B, but in addition to metal lines 244' parallel to the Y axis, may further includes metal lines 244" orthogonal to the metal lines 244' and parallel to the X axis or conveyance direction 240. The set of metal lines includes both 244' and 244". The metal lines 244" may be characterized by an average spacing $S_y$. In some preferred embodiments, the metal lines may be substantially parallel to each other and uniformly spaced. However, other angles and spacing options may be used in a manner similar to that discussed with respect to metal lines 244'. Metal lines 244" may be applied in the same step as 244', or alternatively, may be made separately and/or using a different deposition technology. The width of the metal lines 244' may be about the same as metal lines 244", but in some other embodiments, they may be smaller or larger. The set of metal lines may make a crossed-line grid as shown, or may include a honeycomb shape, or some other pattern. Although adding the set of metal lines 244" as shown in FIG. 2C may in some cases reduce the overall transparency of the composite conductor relative to FIG. 2B, it may in some cases mitigate the effect of defects or discontinuities of metal lines 244' to ensure that charges generated in cell 250 can be transported to cell edge 251 or 252 without high resistance. In some embodiments, $S_y > S_x$. In some cases, the ratio of $S_y$ to $S_x$ may be greater than 1.5, alternatively greater than 2, alternatively greater than 3, or alternatively greater than 5. In this way, the impact on transparency may be reduced while still providing low resistance pathways in the event of a discontinuity in a metal line 244'.

In some embodiments, a set of metal lines (first or second) occupies less than 15% of the active cell surface area, preferably less than 10%, more preferably less than 5%. In some cases, a set of metal lines occupies an active cell surface area in a range of 0.5% to 10%, or alternatively 1 to 5%. In some cases, the average spacing $S_x$ of the metal lines is in a range of 0.1 to 2.0 mm. In some cases, a ratio Sx/W of average spacing $S_x$ of the metal lines to the average width W of the metal lines is in a range of 10 to 100. In some embodiments, the average width W of the metal lines of the first or second set of metal lines is less than 40 µm, preferably less than 30 µm. In some embodiments, the average width W of the metal lines of the first or second set of metal lines may be in a range of 1 to 30 µm, alternatively 2 to 25 µm. In some embodiments, the average height H of the metal lines of the first or second set of metal lines is at least 50 nm, preferably at least 100 nm.

Figure 3:
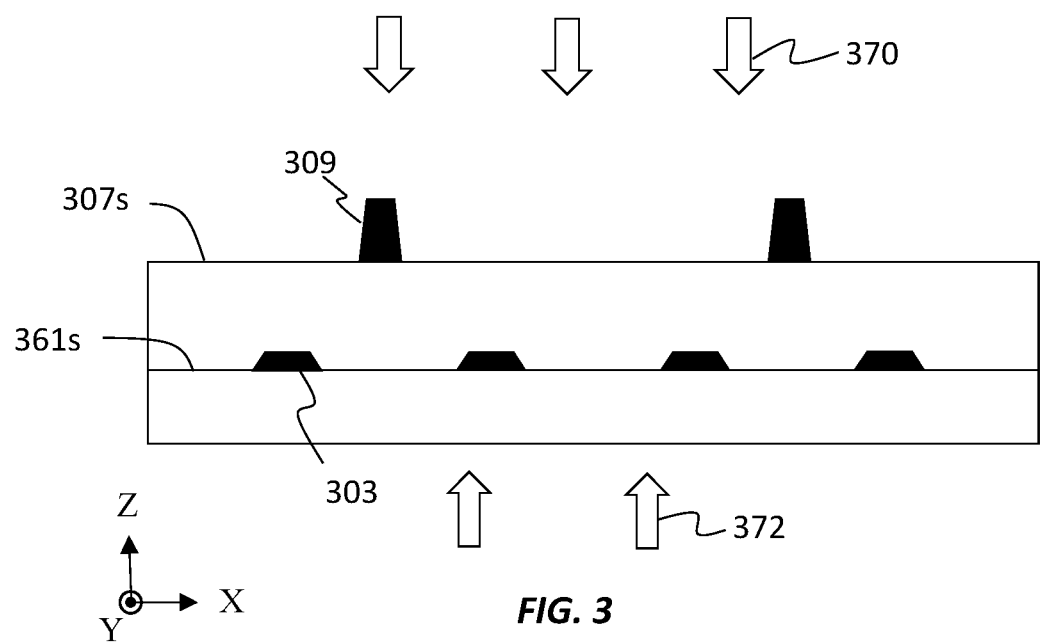
FIG. 3 is a cross-sectional schematic of first and second sets of metal lines according to some embodiments.

FIG. 3 is a cross-sectional schematic of first and second sets of metal lines according to some embodiments. FIG. 3 may be considered analogous to FIG. 1 but simplified to show just the sets of metal lines and the surfaces on which they are applied. A first set of metal lines 303 may be provided in a first pattern on a surface 361s which may correspond to an upper surface of a substrate. A second set of metal lines 309 may be provided on surface 307s, which may correspond to an upper surface of the second conducting layer.

In some embodiments, the first set of metal lines 303 is different in some way relative to the second set of metal lines, besides the location in the photovoltaic stack. In some cases, this difference may be with respect to at least one physical dimension (spacing, height, width, line direction, any ratios thereof, or the like). With respect to physical dimensions, such difference may be at least 5%, alternatively at least 10%, alternatively at least 20%, or alternatively at least 50%. For example, the spacings between the first set of metal lines may be different than the spacings of the second set of metal lines. In FIG. 3, the spacing of second set of metal lines 309 is greater than the spacing of the first set of metal lines 303. This may be preferred in some embodiments where more intense light 370 is expected to be received through the top of the structure relative to light 372 received through the bottom. For example, the top of the structure may be laminated to a window or the like that faces sunlight, and the bottom of the structure may receive less intense ambient room light through the substrate. However, in alternative embodiments, the spacing of the second set of metal lines may be equal to or even less than that of the first set of metal lines.

In some cases, the average width of the first set of metal lines may be different than the second set of metal lines. As shown in FIG. 3, the first set of metal lines may be wider than the second set of metal lines. This may be preferred in some embodiments where more intense light 370 is expected to be received through the top of the structure relative to light 372 received through the bottom. In some embodiments, the average width W1 of the first set of metal lines may be in a range of 15 to 40 µm, whereas the average width W2 of the second set of metal lines may be in a range of 2 to 20 µm. In some printing embodiments, the width of the metal lines may in part be controlled by adjusting the surface energy of the surface on which they are printed. For example, matching a surface energy to an ink may allow for more spreading of the ink and produce wider lines. A mismatch in surface energy may reduce the amount of ink spreading and produce narrower lines.

In some cases, the first set of metal lines may be characterized by a ratio Sx1/W1 of average spacing $S_{x1}$ of the first metal lines to the average width W1 of the first metal lines. Similarly, the second set of metal lines may be characterized by a ratio Sx2/W2 of average spacing $S_{x2}$ of the second metal lines to the average width W2 of the second metal lines. In some embodiments Sx2/W2 is at least 5% greater than Sx1/W1, alternatively at least 10% greater, at least 20% greater or at least 50% greater.

Whether by spacing or line width or both, in some embodiments, the second set of metal lines may in some cases block less light, i.e., have a higher % T (or lower % A) than the first set of metal lines. Alternatively, or in combination, in some cases the % T of the second composite conductor may be higher than the % T of the first composite conductor (or the % A of the second composite conductor may be lower than the % A of the first composite conductor). Again, higher % T (or lower % A) for the second set of metal lines and the second composite conductor may be preferred where more intense light 370 is expected to be received through the top of the structure relative to light 372 received through the bottom. However, in alternative embodiments, the average width of the second set of metal lines may be equal to or even greater than average width of the first set of metal lines.

In some cases, the average height of the first set of metal lines may be different than the average height of the second set of metal lines. As shown in FIG. 3, the second set of metal lines 309 may be thicker (greater height) than the first set of metal lines 303. By keeping the first set of metal lines relatively short, it is easier for the first conducting layer to be coated in a manner that more fully covers the metal lines. Further, low-height first metal lines may be better suited for the deposition of other device layers which may thicknesses on the order of 10's to 100's of nanometers. In some embodiments, the average height of the first set of metal lines may be less than 300 nm, preferably less than 200 nm, more preferably less than 150 nm. For example, in some cases the average height H1 of the first set of metal lines may be in a range of about 20-200 nm, alternatively in a range of 50-150 nm. In some cases, the second set of metal lines may have a height of greater than 50 nm, alternatively greater than 100 nm, alternatively greater than 200 nm, or alternatively greater than 500 nm. For example, in some cases the average H2 of the second set of metal lines may be in a range of 200-1500 nm. In some embodiments when printing a second set of metal lines, it may be difficult to fully sinter the metal without damaging the underlying perovskite or other layers. As such, the intrinsic resistivity of the metal line material may be higher than for a fully sintered metal line material. In such cases it may be preferred to deposit a thicker metal line to compensate. However, in some alternative embodiments, the second set of metal lines may have about the same height or even a lower height relative to the first set of metal lines.

In some embodiments, a second set of metal lines may, as shown in FIG. 3, have a combination of narrower width, greater height, and greater spacing, relative to the first set of metal lines. In some cases, the second set of metal lines may substantially align with the first set of metal lines (e.g., FIG. 1), alternatively, they may not align (e.g., FIG. 3), or in other embodiments, some may align while others may not.

Figure 4A:
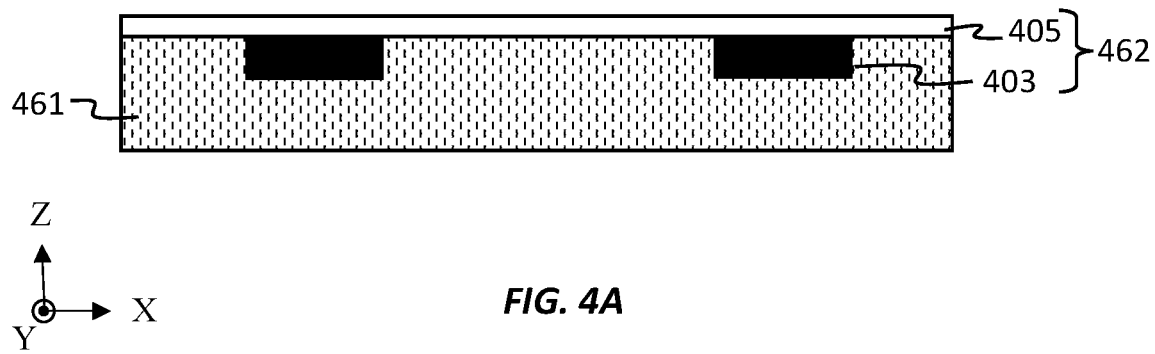
FIG. 4A is a cross-sectional view of a portion of a photovoltaic structure illustrating embedded metal lines.

In some embodiments, the first set of metal lines may be embedded in the substrate. FIG. 4A is a cross-sectional view of a portion of a photovoltaic structure illustrating embedded metal lines. A first set of metal lines 403 may be embedded in substrate 461 such that the top surface of the metal lines may approximately match the top surface of substrate 461. The first conductive layer 405 may smoothly overlay the substrate and embedded metal lines to form composite conductor 462. In some cases, the metal line surface may be above or below the plane of the substrate surface, but in such cases, it may be preferred that this displacement is less than the thickness of the first conductive layer or the total device structure. The metal lines may be embedded using a variety of methods. For example, a prepatterned doner sheet having the metal lines may be pressed into a substrate under temperature and pressure to partially melt the upper area of the substrate and allow transfer of the embedded metal lines with removal of the donor sheet. Alternatively, a substrate material may be melt-cast over a pattern of metal lines on a donor surface, and upon cooling, the solid polymer substrate may be peeled away along with the metal lines.

Figure 4B:
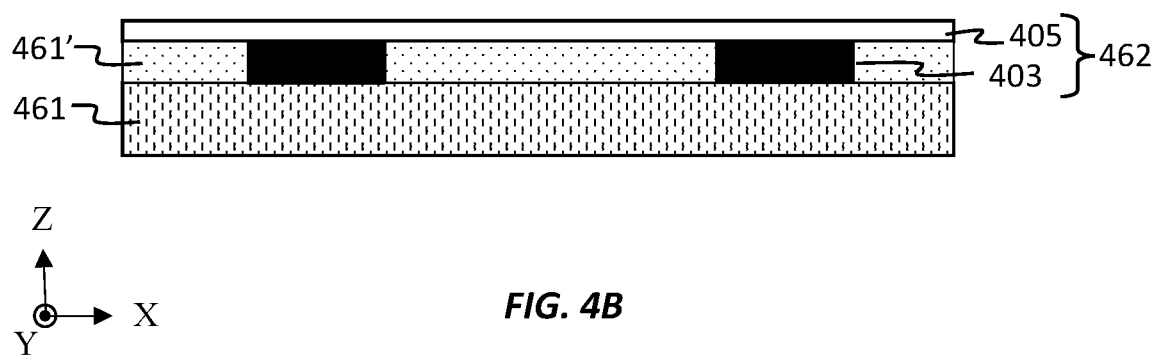
FIG. 4B is a cross-sectional view of a portion of a photovoltaic structure illustrating another embodiment of embedded metal lines.

FIG. 4B is a cross-sectional view of a portion of a photovoltaic structure illustrating another embodiment of embedded metal lines. FIG. 4B may be similar to FIG. 4A except that it includes a patterned smoothing layer 461' over substrate 461, and the top surface of the smoothing layer 461' may approximately match the top surface of the metal lines 403. In some cases, the patterned smoothing layer may be made from a photosensitive polymer such as a photoresist. For example, a first set of metal lines may be patterned on the substrate 461. A negative-type photoresist layer may be applied over the substrate and metal lines, and exposed with an appropriate patterning radiation wavelength from the back (through the substrate). The metal lines may act as an in situ optical mask. Upon development, the exposed resist remains in place between the metal lines, while areas of the photoresist that had been above the lines are developed away.

Figure 4C:
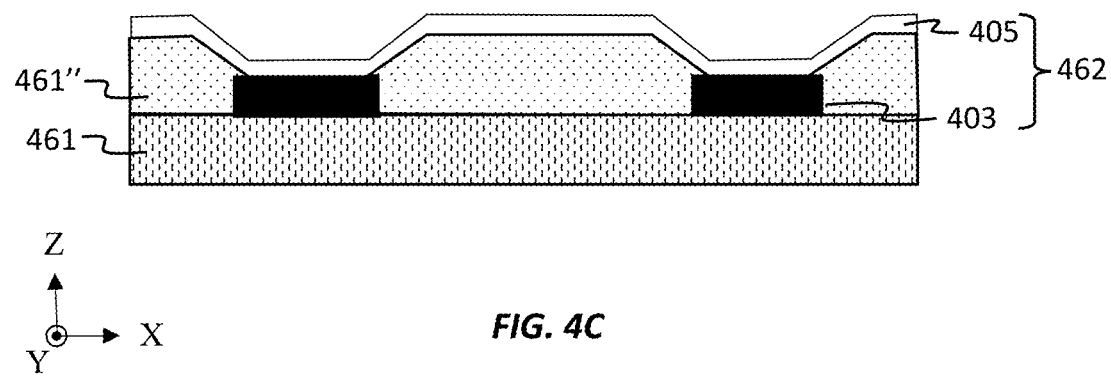
FIG. 4C is a cross-sectional view of a portion of a photovoltaic structure illustrating another embodiment of embedded metal lines.

FIG. 4C is a cross-sectional view of a portion of a photovoltaic structure illustrating another embodiment of embedded metal lines. FIG. 4C may be similar to FIG. 4B except that the patterned smoothing layer 461" may include a taper near the edge of the metal lines 403 to allow a continuous coating of the electrically conductive layer 405 even though portions of the smoothing layer may extend higher than the surface of the metal lines (higher even than the thickness of the electrically conductive layer). Such a smoothing layer may also be provided by photosensitive polymers or photolithographic methods.

The first set of metal lines may be characterized by a first metallic composition and the second set of metal lines may be characterized by a second metallic composition. In some embodiments, the first metallic composition is different from the second metallic composition by greater than 10%, alternatively greater than 20%, with respect to at least one element's atomic % (or weight %) or with respect to morphology, such as particle size, shape, surface roughness, or porosity. For example, relative to the first metallic composition, a second metallic composition may have a different amount of silver or copper or residual binder. In some embodiments, the first and second sets of metal lines may include sintered metal particles, wherein the average particle size or grain size of metal particles in the second set of metal lines is higher than that of the first set of metal lines. One metallic composition may be formed from large particles and the other smaller. One metallic composition may use metallic nanowires and the other does not. Differences in metallic compositions may include differences in total pore volume, average pore size, or pore size distribution.

Functional Sheet Resistance Metrics

Although the conductivity or resistivity of a composite conductor can be described in party by intrinsic properties of the metal lines and conducting layer materials, it is important to understand the effective conductivity properties of the composite as it may behave in a device architecture. That is, simple sheet resistance measurements may not account for the spatial and directional asymmetries present in a composite conductor. In some cases, a functional or composite sheet resistance may instead be measured or calculated which better correlates to device performance.

For example, in the composite conductor shown in FIG. 2, the primary direction of current flow is in the direction of the metal lines. A functional sheet resistance ($R_{functional}$) for this composite conductor may in some cases be defined by the geometric and material parameters of the metal lines and conducting layer as according to Equation 1

$$R_{functional} = \frac{1}{\frac{f*W*H}{\rho_{ML}*S_X} + \frac{1}{R_{S,CL}}} \quad (1)$$

where W is the metal line width (cm), H is the metal line height (cm), f is a dimensionless number that defines the fraction of the W*H cross-section occupied by metal, $\rho_{ML}$ is the metal resistivity ($\Omega$*cm), $S_X$ is the average spacing of metal lines in the X-direction (cm), and $R_{S,CL}$ is the sheet resistance of the conducting layer ($\Omega$*■$^{-1}$). This functional resistance calculation is useful for composite conductors with metal lines parallel to direction 246 and composite conductors with metal lines parallel to directions 246 and 240, but may require modification where lines deviate from these axes, include curvature, or contain zig-zag patterns.

Figure 5A:
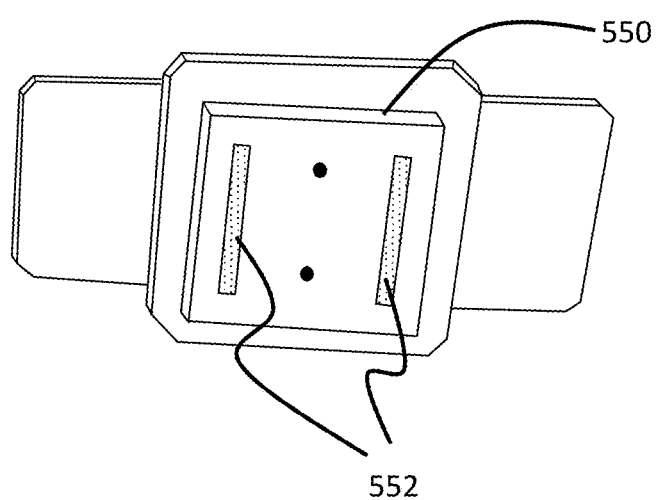
FIG. 5A is photograph of a resistance measurement tool according to some embodiments.
Figure 5B:
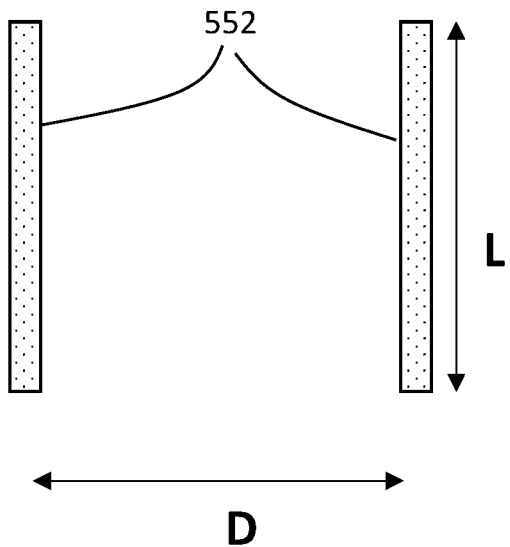
FIG. 5B illustrates certain dimensions of the resistance measurement tool.
Figure 5C:
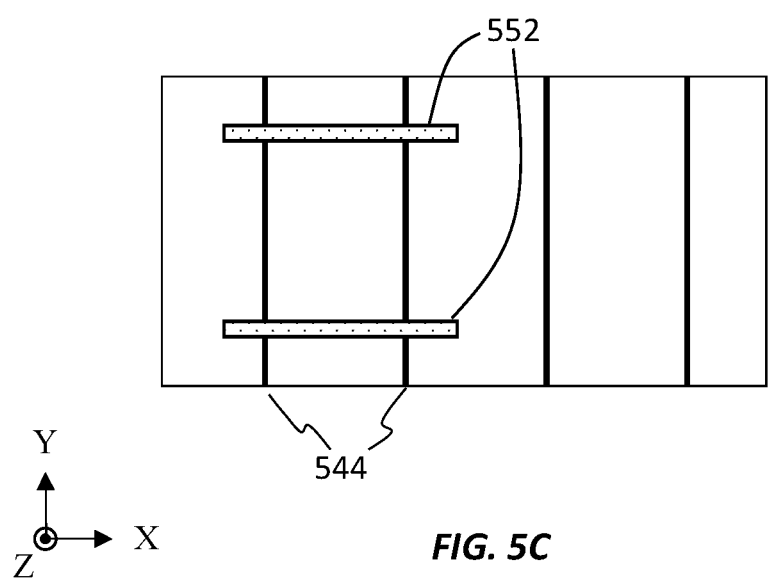
FIG. 5C illustrates an orientation of the resistance measurement tool to a composite conductor.
Figure 5D:
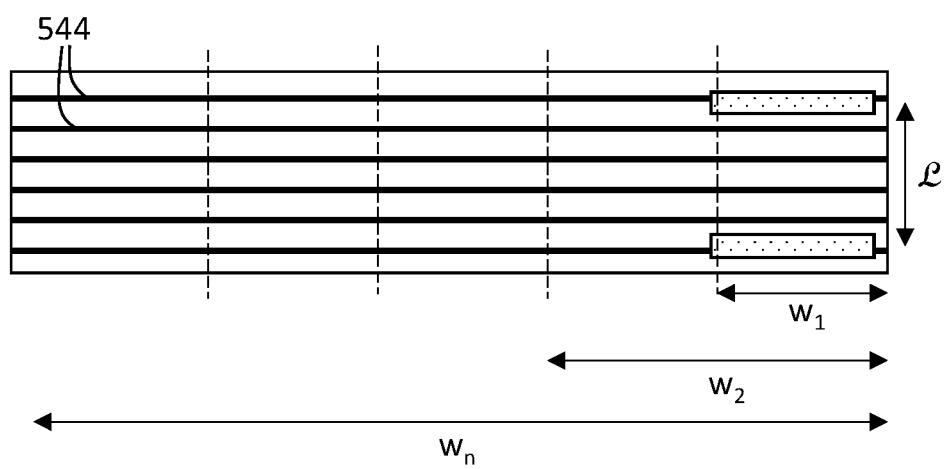
FIG. 5D illustrates another orientation of the resistance measurement tool to a composite conductor.

FIG. 5A is photograph of a resistance measurement tool according to some embodiments. FIG. 5B illustrates certain dimension of the resistance measurement tool. Electrical measurement of composite conductors may be achieved using the tool 550, which includes two parallel conductors 552 with length L fixed a distance D from one another, connected through a multimeter or other resistance measurement apparatus. Note that L is equal in magnitude to D and corresponds to a probe dimension $\mathcal{L}$. When resistance of the metal lines 544 of a composite conductor is sufficiently lower than conducting layer sheet resistance $R_{S,CL}$, functional sheet resistance may be directly measured by positioning this tool with the measurement probes oriented perpendicular to the metal line direction as shown in FIG. 5C. Orienting the probes parallel to the metal line direction as shown in FIG. 5D may also allow approximation of the conducting layer sheet resistance by performing multiple measurements on samples of different width ($w_1, w_2 \ldots w_n$). Conducting layer sheet resistance may thus be approximated by the slope of a linear fit of measured resistance vs. $\mathcal{L}$/w, where $\mathcal{L}$ is the probe dimension and w the sample width.

Adhesion Layer and Superstrate

In some embodiments, the adhesion layer may be applied as liquid or gel followed by a curing step, typically while in contact with the superstrate. Some non-limiting examples of curing may include exposure to UV radiation or heat that may cause a chemical reaction such as polymerization. In some cases, the liquid or gel adhesive may first be partially cured prior to contact with the superstrate. In some embodiments, the adhesion layer includes a polymer that does not need UV curing. For example, the adhesion layer may include a pressure sensitive adhesive material. In some preferred embodiments, the adhesion layer is formed by melt lamination (e.g., in a vacuum laminator) of a thermoplastic film. Some non-limiting examples of thermoplastic films may include thermoplastic polyolefins (TPO) such as so-called BPO films available from Quentys, or vinyl acetate-based copolymers such as ethylene-vinyl acetate (EVA) film. The melt lamination step can cause the thermoplastic to become tacky and allow adherent bonding to the superstrate. Further, the thermoplastic has some advantageous encapsulation properties that can help prolong the useful life of the photovoltaic structure. In some cases, TPO films are preferred since EVA may sometimes release acetic acid over time. In some embodiments, the adhesion/encapsulation layer may include a UV absorbing material. In some cases, the adhesion/encapsulation layer may have a thickness in a range of 0.02-1.0 mm, alternatively 0.1-0.8 mm.

The superstrate may be selected from any of the materials listed with respect to the substrate. In some preferred embodiments, the superstrate is glass, which may be flexible or rigid. The superstrate may in some cases be a window or other structure intended to support the photovoltaic structure in operation. In some embodiments, the photovoltaic structure as shown in FIG. 1 may be laminated to a support structure such as a window with second adhesion layer (window and second adhesion layer not shown). Such lamination may be between the substrate and the window, or between the superstrate and the window. In some embodiments, the superstrate may include a UV-absorbing material or layer.

The superstrate may in some cases include one or more optical layers or other features to enhance the transmission of light into photovoltaic structure. For example, the interface of the superstrate with the adhesion layer may include a light scattering layer or surface structure. In some designs, this may reduce the amount of light that may be lost by reflection off the second set of metal lines.

Although not shown, in some cases when the substrate is plastic, the bottom of the substrate may be bonded to a secondary glass substrate (flexible or solid) by a secondary adhesion layer. This may help to encapsulate the photovoltaic structure and reduce ingress of water or other potentially harmful environmental gasses and liquids through the plastic substrate.

Manufacturing System

Figure 6:
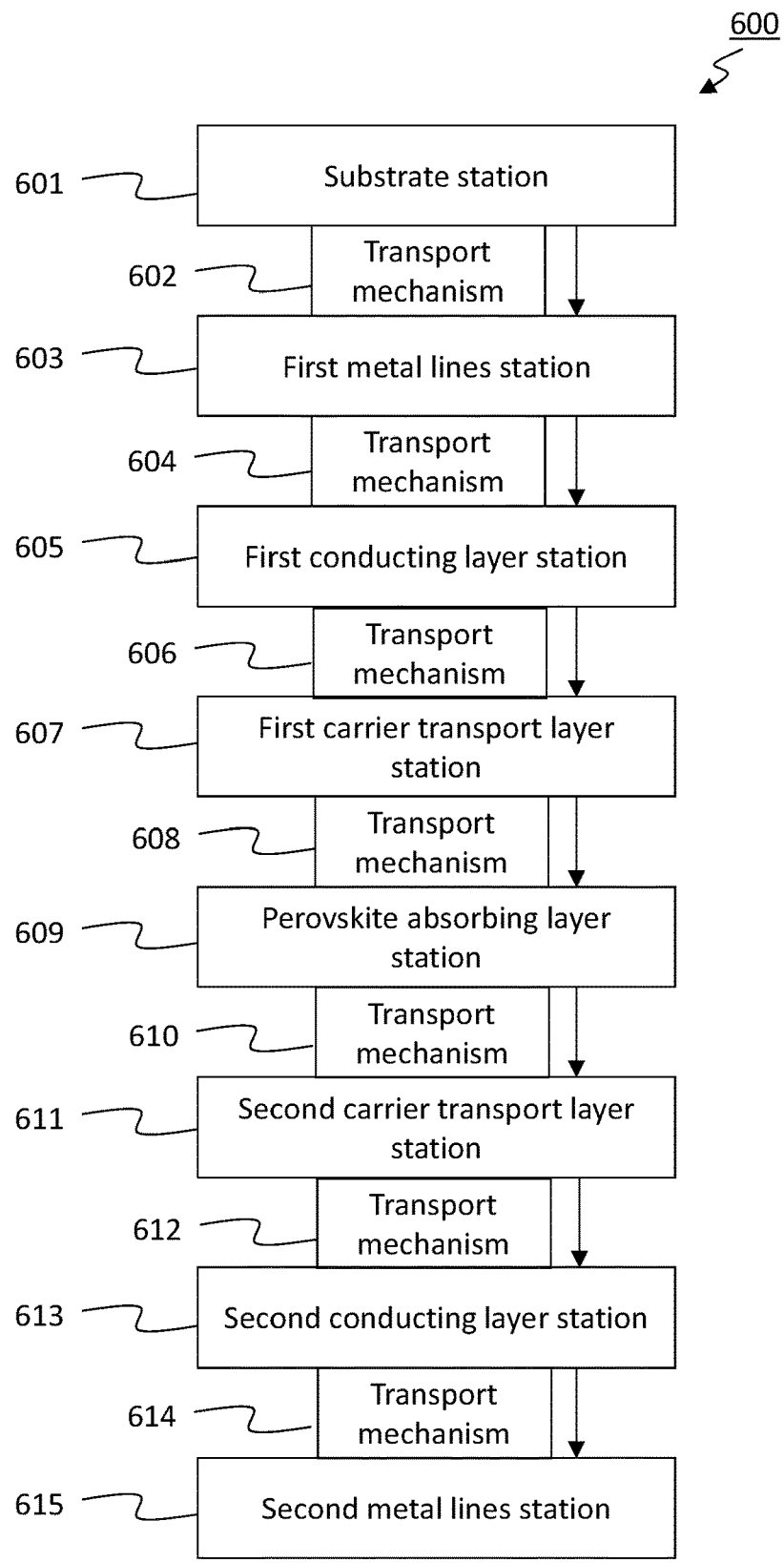
FIG. 6 is a schematic diagram illustrating a photovoltaic structure manufacturing system according to some embodiments.

FIG. 6 is a schematic diagram illustrating a photovoltaic structure manufacturing system according to some embodiments. In some preferred embodiments, manufacturing system 600 may use roll-to-roll processing. However, in some cases, the manufacturing system may instead operate using cut sheets. Alternatively, some process steps may be performed using roll-to-roll process and one or more later steps may be performed using cut sheets.

Manufacturing system 600 may include a substrate station 601 where substrate material is loaded. In some preferred examples, a roll of substrate material may be provided at substrate station 601. Alternatively, a plurality of precut substrate sheets may be provided, optionally mounted in a frame and/or optionally stacked. For example, the substrate may be flexible glass or a polyester film. Whether from a roll or as a cut sheet, the substrate may be moved to a first metal lines station 603 via transport mechanism 602. The first metal lines station 603 may, for example, include a flexographic printing apparatus for printing the first set of metal lines such as silver metal lines. Prior to forming the first set of metal lines, the surface of the substrate may in some cases be treated or cleaned (e.g., with an air knife, plasma, corona discharge, or UV/ozone) by a surface treatment apparatus. Note that an "air knife" herein may use a gas other than air, for example, nitrogen. The surface treatment apparatus may be part of the first metal lines station or part of some earlier station. The first metal lines station may in some cases further include a metal line post-treatment apparatus for removing solvent and sintering the metal lines to improve conductivity. The post-treatment apparatus may include a heating apparatus, for example, an oven, a hot air knife, an IR lamp, a flashlamp, hot roller(s), hot plate(s), compression force, or some combination.

After forming the first set of metal lines, the film structure may be moved to a first conducting layer station 605 via transport mechanism 604. The first conducting layer station 605 may, for example, include a TCO deposition apparatus such as an aerosol-based TCO deposition apparatus. Prior to depositing the first conducting layer, the surface of the film structure may in some cases be treated or cleaned (e.g., with an air knife, plasma, corona discharge, or UV/ozone) by a surface treatment apparatus. The surface treatment apparatus may be part of the first conducting layer station or part of some earlier station. The first conducting layer station may in some cases further include a conducting layer post-treatment apparatus, e.g., a heating apparatus, which may improve the properties of the first conducting layer.

After depositing the first conducting layer, the film structure may be moved to a first carrier transport layer station 607 via transport mechanism 606. For example, the first carrier transport layer station 607 may include a coating apparatus for depositing a first carrier transport material, e.g., by slot die, gravure, ALD, PECVD, or an aerosol-based deposition apparatus. Prior to coating the first carrier layer, the surface of the film structure may in some cases be treated or cleaned (e.g., with an air knife, plasma, corona discharge, or UV/ozone) by a surface treatment apparatus. The surface treatment apparatus may be part of the first carrier layer station or part of some earlier station. The first carrier station may in some cases further include a carrier layer post-treatment apparatus, e.g., a heating apparatus, which may improve the properties of the first carrier layer.

After depositing the first carrier layer, the film structure may be moved to a perovskite absorbing layer station 609 via transport mechanism 608. For example, the perovskite absorbing layer station 609 may include a coating apparatus for depositing a perovskite material, e.g., by slot die or gravure Prior to coating the perovskite absorbing layer, the surface of the film structure may in some cases be treated or cleaned (e.g., with an air knife, plasma, corona discharge, or UV/ozone) by a surface treatment apparatus. The surface treatment apparatus may be part of the first carrier layer station or part of some earlier station. The perovskite absorbing layer station may in some cases further include a perovskite layer post-treatment apparatus, e.g., a heating apparatus, for drying the perovskite layer. Drying of the perovskite coating may in some cases utilize a series of heating chambers to control the rate of drying for improved layer performance. In some cases, annealing or other heating methods may include the use of heated nip rollers, optionally under nitrogen.

After depositing the perovskite absorbing layer, the film structure may be moved to a second carrier transport layer station 611 via transport mechanism 610. For example, the second carrier transport layer station 611 may include a coating apparatus for depositing a second carrier transport material, e.g., by slot die, gravure, ALD, PECVD, or an aerosol-based deposition apparatus. Prior to coating the second carrier transport layer, the surface of the film structure may in some cases be treated or cleaned (e.g., with air knife, plasma, corona discharge, or UV/ozone) by a surface treatment apparatus. The surface treatment apparatus may be part of the second carrier layer station or part of some earlier station. The second carrier transport station may in some cases further include a carrier layer post-treatment apparatus, e.g., a heating apparatus, which may improve the properties of the second carrier layer.

After forming the second carrier transport, the film structure may be moved to a second conducting layer station 613 via transport mechanism 612. The second conducting layer station 613 may, for example, include a TCO deposition apparatus such as an aerosol-based TCO deposition apparatus. Prior to coating the second conducting layer, the surface of the film structure may in some cases be treated or cleaned (e.g., with an air knife, plasma, corona discharge, or UV/ozone) by a surface treatment apparatus. The surface treatment apparatus may be part of the second carrier layer station or part of some earlier station. The second conducting layer station may in some cases further include a conducting layer post-treatment apparatus, e.g., a heating apparatus, which may improve the properties of the second conducting layer.

After forming the second conducting layer, the film structure may be moved to a second metal lines station 615 via transport mechanism 614. The second metal lines station 615 may, for example, include a flexographic printing apparatus for printing the second set of metal lines such as silver metal lines. Prior to forming the second set of metal lines, the surface of the substrate may in some cases be treated or cleaned (e.g., with an air knife, plasma, corona discharge, or UV/ozone) by a surface treatment apparatus. The surface treatment apparatus may be part of the second metal lines station or part of some earlier station. The second metal lines station may in some cases further include a metal line post-treatment apparatus for removing solvent and sintering the metal lines to improve conductivity. The post-treatment apparatus may include a heating apparatus, for example, an oven, a hot air knife, an IR lamp, a flashlamp, hot roller(s), hot plate(s), compression force, or some combination.

Although not shown, manufacturing apparatus 600 may further include stations for depositing one or more interfacial layers over the first composite electrode or between other layer of the photovoltaic device, or for applying the adhesive/encapsulation layer, superstrate, cutting, scribing and other operations. Any or all of the stations of manufacturing apparatus 600 may include quality control or inspection tools. Such tools may send data to a central operation station for monitoring the status of manufacturing and optionally to modify the operation of one or more apparatuses to bring it into compliance with operating parameters.

EXAMPLES

Some non-limiting examples of various photovoltaic structures and components are provided below.

Example 1—First Composite Conductor on PET

A flexible polyester substrate having a width of 33 cm was conveyed through a roll-to-roll deposition and drying device made by Polytype Converting at a constant speed of 48 meters per minute. In the deposition section a silver nanoparticle ink (Genesink Smart Flexo SS-CS31506) was printed onto the flexible polyester substrate using a flexographic printing process. The flexographic process used a 1.7 BCMI (billions of cubic microns per square inch) anilox to deliver ink to a Kodak Flexcel flexographic plate mounted using 3M flexographic tape which delivered the silver ink to the moving flexible polyester web. The flexible polyester with printed silver ink was subsequently dried and sintered in an 18-meter-long convection oven set to a temperature of 120° C., followed by rewinding the printed flexible polyester roll. Sections of the printed flexible polyester roll were cut into sheets and provided to a sheet-to-sheet aerosol deposition device for deposition of an indium tin oxide (ITO) conducting layer. The resulting first composite conductor include a first set of metal lines (with average width W of 31.4 µm, average height H of 108 nm, and spacing Sx of 600 µm) combined with a first conducting layer of ITO having a sheet resistance of 293±10 $\Omega^*\blacksquare^{-1}$. The polyester substrate itself has a transmission of 91% for light of wavelength 525-575 nm, and the first composite conductor is expected to have a transmittance of approximately 92% for 525-575 nm light it receives through the polyester substrate based on an area coverage of 5.2% for the opaque first metal lines and an absorption of 3% for the ITO first conducting layer, resulting in a net transmission of approximately 83.7% through the substrate and first composite conductor. The resulting functional sheet resistance of this first composite conductor was measured as 21.1 $\Omega$.

Example 2—First Composite Conductor on Flexible Glass

A flexible glass substrate having a width of 33 cm was conveyed through a roll-to-roll deposition and drying device made by Polytype Converting at a constant speed of 30 meters per minute. In the deposition section a silver nanoparticle ink (Genesink Smart Flexo SS-CS31506) was printed onto the flexible glass substrate using a flexographic printing process. The flexographic process used a 3.0 BCMI (billions of cubic microns per square inch) anilox to deliver ink to a Kodak Flexcel flexographic plate mounted using 3M flexographic tape which delivered the silver ink to the moving flexible glass web. The flexible glass with printed silver ink was subsequently dried and sintered in an 18-meter-long convection oven set to a temperature of 170° C., followed by rewinding the printed flexible glass roll. Sections of the printed flexible glass roll were cut into sheets and provided to a sheet-to-sheet aerosol deposition device for deposition of an indium tin oxide (ITO) first conducting layer. The resulting first composite conductor included a first set of metal lines (with average width W of 30.8 µm, average height H of 123 nm, spacing Sx of 600 µm, and resistivity of 6.5 µ$\Omega$-cm) combined with a first conducting layer of ITO having a sheet resistance of 300 $\Omega^*\blacksquare^{-1}$. The glass substrate itself has a transmission of 90% for light of wavelength 525-575 nm, and the first composite conductor is expected to have a transmittance of approximately 90% for 525-575 nm light it receives through the glass substrate based on an area coverage of 5.1% for the opaque first metal lines and an absorption of 5% for the ITO first conducting layer, resulting in a net transmission of approximately 81% through the substrate and first composite conductor. The resulting functional sheet resistance of this first composite conductor was measured as 16.5 $\Omega$.

Example 3—Second Composite Conductor Using Silver Ink

A flexible multilayer ITO/polyester substrate coated with a poly(triaryl amine) (PTAA) hole-transport material and a methylammonium lead iodide perovskite solution of dimension 10×15 was provided to a sheet-to-sheet aerosol deposition device for deposition of an indium tin oxide (ITO) second conducting layer. The second conducting layer sheet resistance was about 700-1000 $\Omega^*\blacksquare^{-1}$ based on measurements of parallel samples.

Silver second metal lines were then deposited on the second conducting layer using an IGT F1-100 printability tester. Silver nanoparticle ink was applied to a 1.0 BCMI (billions of cubic microns per square inch) anilox which delivered ink to a Kodak Flexcel flexographic plate mounted using 3M flexographic tape. Silver ink was delivered from the flexographic plate to the flexible multilayer substrate moving at 24 meters per minute, and samples dried and sintered on a hot plate set to 100° C. The resulting second composite conductor included a second conducting layer of 700-1000 $\Omega^*\blacksquare^{-1}$ ITO with second metal lines with average width W of 24.6 µm, average height H of 139 nm, and spacing Sx of 600 µm. The second composite conductor is expected to have a transmittance of approximately 93% for 525-575 nm light it receives based on an area coverage of 4.1% for the opaque second metal lines and an absorption of 3% for the ITO second conducting layer. The resulting functional sheet resistance of this second composite conductor was estimated to be 15-50$\Omega$ based on second metal line resistivity $\rho_{ML}$ in the range of 5-20 µ$\Omega$-cm.

Example 4—Second Composite Conductor Using Silver Ink

Example 4 was like Example 3, except that the silver nanoparticle ink was applied to a 2.0 BCMI anilox. The resulting second composite conductor included a second conducting layer of 700-1000 $\Omega^*\blacksquare^{-1}$ ITO with second metal lines with average width W of 38.2 µm, average height H of 278 nm, and spacing Sx of 600 µm. The second composite conductor is expected to have a transmittance of approximately 90.8% for 525-575 nm light it receives based on an area coverage of 6.4% for the opaque second metal lines and an absorption of 3% for the ITO second conducting layer. The resulting functional sheet resistance of this second composite conductor was estimated to be 4-18$\Omega$ based on second metal line resistivity $\rho_{ML}$ in the range of 5-20 µ$\Omega$-cm.

Example 5—Second Composite Conductor Using Copper Ink

A flexible multilayer ITO/polyester substrate coated with a poly(triaryl amine) (PTAA) hole-transport material and a methylammonium lead iodide perovskite solution of dimension 10×15 was provided to a sheet-to-sheet aerosol deposition device for deposition of an indium tin oxide second conducting layer. The second conducting layer sheet resistance was about 700-1000 $\Omega^*\blacksquare^{-1}$ based on measurements of parallel samples.

Copper second metal lines were then deposited on the second conducting layer using an IGT F1-100 printability tester. Copper nanoparticle ink (Copprint LF350) was applied to a 1.0 BCMI (billions of cubic microns per square inch) anilox which delivered ink to a Kodak Flexel flexographic plate mounted using 3M flexographic tape. Copper ink was delivered from the flexographic plate to the flexible multilayer substrate moving at 24 meters per minute, and samples dried and sintered on a hot plate set to 100° C. The resulting second composite conductor included a second conducting layer of 1000 $\Omega * \blacksquare^{-1}$ ITO with second metal lines with average width W of 21.0 μm, average height H of 578 nm, and spacing Sx of 600 μm. The second composite conductor is expected to have a transmittance of approximately 93.6 for 525-575 nm light it receives based on an area coverage of 3.5% for the opaque second metal lines and an absorption of 3% for the ITO second conducting layer. The resulting functional sheet resistance of this second composite conductor was estimated to be 8-25Ω based on second metal line resistivity $\rho_{ML}$ in the range of 10-30 μΩ-cm.

Example 6—Second Composite Conductor Using Copper Ink

Example 6 was like Example 5, except that the copper nanoparticle ink was applied to a 2.0 BCMI anilox. The resulting second composite conductor included a second conducting layer of 1000 $\Omega * \blacksquare^{-1}$ ITO with second metal lines with average width W of 29.8 μm, average height H of 1159 nm, and spacing Sx of 600 μm. The second composite conductor is expected to have a transmittance of approximately 92.2% for 525-575 nm light it receives based on an area coverage of 5.0% for the opaque second metal lines and an absorption of 3% for the ITO second conducting layer. The resulting functional sheet resistance of this second composite conductor was estimated to be 3-8Ω based on second metal line resistivity $\rho_{ML}$ in the range of 10-30 μΩ-cm.

Examples 1-6 demonstrate that the parameters for the first and second sets of metal lines may be controlled to provide desired relative percent transmissions for the first and second composite conductors while also controlling desired relative functional sheet resistances for such composite conductors, thus enabling improved combined manufacturability and performance of resulting devices including such first and second composite conductive layer. While embodiments of composite conductors with percent transmissions of between 90.0 and 93.6% are specifically described, higher or lower percent transmissions may be obtained by further varying the relative line widths and spacings of the metal lines, and more specifically, e.g., a transmittance higher than 95% by providing an area coverage of approximately 2.0% or less for a set of opaque metal lines and an absorption of 3% for an ITO conducting layer in a composite conductor.

Example 7—Monofacial Photovoltaic Structure on Glass

Although not a bifacial example, Example 7 shows that the first composite conductor is effective for use in a photovoltaic structure. A perovskite photovoltaic device was fabricated on the first composite electrode of Example 2 using lab procedures. A poly(triaryl amine) (PTAA) hole-transport material and a methylammonium lead iodide perovskite solution were successively blade coated from solution, followed by thermal evaporation of C60, bathocuproine (BCP), and copper cathode. The finished perovskite photovoltaic device was interrogated using a TS-Space solar simulator with AM1.5G irradiance, which confirmed the device to be functional.

ENUMERATED EMBODIMENTS

Still further embodiments herein include the following enumerated embodiments.

1. A bifacial photovoltaic structure including:
a) a transparent substrate;
b) a transparent first composite conductor overlaying the transparent substrate, the first composite conductor including a first set of metal lines and a first conducting layer provided in contact with the first set of metal lines, wherein the first set of metal lines is characterized by a first set of dimensions and a first metallic composition;
c) a first carrier transport layer overlaying the first composite conductor
d) a perovskite absorber layer overlaying the first carrier transport layer;
e) a second carrier transport layer overlaying the perovskite absorber layer; and
f) a transparent second composite conductor overlaying the second carrier transport layer, the second composite conductor including a second conducting layer and a second set of metal lines provided in contact with the second conducting layer, wherein the second set of metal lines is characterized by a second set of dimensions and a second metallic composition,
wherein:
i) at least one dimension of the first set of dimensions is different than a corresponding dimension of the second set of dimensions by greater than 20%;
ii) the first metallic composition is different than the second metallic composition with respect to elemental composition or morphology; or
iii) both i) and ii).
2. The bifacial photovoltaic structure of embodiment 1, wherein the first set of metal lines is provided over the transparent substrate and the first conducting layer is provided over the first set of metal lines and over the transparent substrate.
3. The bifacial photovoltaic structure of embodiment 1 or 2, wherein the second conducting layer is provided over the second carrier transport layer and the second set of metal lines is provided over the second conducting layer.
4. The bifacial photovoltaic structure of embodiment 1, wherein the first conducting layer is provided over the transparent substrate and the first set of metal lines is provided over the first conducting layer. 5. The bifacial photovoltaic structure of embodiment 1, 2 or 4, wherein the second set of metal lines is provided over the second carrier transport layer and the second conducting layer is provided over the second set of metal lines and over the second carrier transport layer.
6. A bifacial photovoltaic structure for converting light of a target wavelength range to electricity, the photovoltaic structure including:
a) a transparent substrate;
b) a transparent first composite conductor overlaying the transparent substrate, the first transparent composite conductor including a first set of metal lines and a first conducting layer provided in contact with the metal lines, wherein the first composite conductor is characterized by an average first % T or an average first % A within the target wavelength range;
c) a first carrier transport layer overlaying the first composite conductor d) a perovskite absorber layer overlaying the first carrier transport layer;
e) a second carrier transport layer overlaying the perovskite absorber layer; and
f) a transparent second composite conductor overlaying the second carrier transport layer, the second composite conductor including a second conducting layer and a second set of metal lines provided in contact with the second conducting layer, wherein the second composite conductor is characterized by an average second % T or an average second % A within the target wavelength range.

7. The bifacial photovoltaic structure of embodiment 6, wherein the first set of metal lines is provided over the transparent substrate and the first conducting layer is provided over the first set of metal lines and over the transparent substrate.

8. The bifacial photovoltaic structure of embodiment 6 or 7, wherein the second conducting layer is provided over the second carrier transport layer and the second set of metal lines is provided over the second conducting layer.

9. The bifacial photovoltaic structure of embodiment 6, wherein the first conducting layer is provided over the transparent substrate and the first set of metal lines is provided over the first conducting layer.

10. The bifacial photovoltaic structure of embodiment 6, 7 or 9, wherein the second set of metal lines is provided over the second carrier transport layer and the second conducting layer is provided over the second set of metal lines and over the second carrier transport layer.

11. The bifacial photovoltaic structure according to any of embodiments 6-10 wherein the second % T is larger than the first % T or the second % A is smaller than the first % A.

12. The photovoltaic structure according to any of embodiments 1-11, wherein the first set of metal lines have an average width W1 that is larger than an average width W2 of the second set of metal lines.

13. The photovoltaic structure according to any of embodiments 1-12, wherein the first set of metal lines have an average height H1 that is smaller than an average height H2 of the second set of metal lines.

14. The photovoltaic structure according to any of embodiments 1-13, wherein the first set of metal lines include substantially parallel lines that align with the direction of current flow during operation.

15. The photovoltaic structure of embodiment 14, wherein the first set of metal lines further includes additional lines generally transverse to the substantially parallel lines and forms a crossed-line grid structure.

16. The photovoltaic structure of embodiment 14, wherein the first set of metal lines does not include a crossed-line grid structure.

17. The photovoltaic structure according to any of embodiments 14-16, wherein the parallel lines are uniformly spaced by an average distance of 0.1 to 2.0 mm.

18. The photovoltaic structure according to any of embodiments 1-17, wherein the second set of metal lines include substantially parallel lines that align with the direction of current flow during operation.

19. The photovoltaic structure of embodiment 18, wherein the second set of metal lines further includes additional lines generally transverse to the substantially parallel lines and forms a crossed-line grid structure.

20. The photovoltaic structure of embodiment 18, wherein the second set of metal lines does not include a crossed-line grid structure.

21. The photovoltaic structure according to any of embodiments 18-20, wherein the parallel lines of the second set of metal lines are uniformly spaced by an average distance of 0.1 to 2.0 mm.

22. The photovoltaic structure according to any of embodiments 1-21, wherein the first composite conductor is characterized by a first functional sheet resistance, the second composite conductor is characterized by a second functional sheet resistance, and a ratio of the first composite sheet resistance to the second composite sheet resistance is in a range of 0.5 to 2.0.

23. The photovoltaic structure according to any of embodiments 1-22, wherein the first composite conductor has a first functional sheet resistance of less than 50 ohms, or optionally less than 20 ohms.

24. The photovoltaic structure according to any of embodiments 1-23, wherein the first conducting layer has an intrinsic sheet resistance in a range of 200 to 1000 ohms/square.

25. The photovoltaic structure according to any of embodiments 1-24, wherein the second composite conductor has a second functional sheet resistance of less than 50 ohms, or optionally less than 20 ohms.

26. The photovoltaic structure according to any of embodiments 1-25, wherein the second conducting layer has an intrinsic sheet resistance in a range of 200 to 1000 ohms/square.

27. The photovoltaic structure according to any of embodiments 1-26, wherein the first set of metal lines has an average width W1 of less than 40 μm.

28. The photovoltaic structure according to any of embodiments 1-27, wherein the second set of metal lines has an average width W2 of less than 20 μm.

29. The photovoltaic structure according to any of embodiments 1-28, wherein the first set of metal lines has an average height H1 in a range of 50 to 200 nm.

30. The photovoltaic structure according to any of embodiments 1-29, wherein the second set of metal lines has an average height H2 in a range of 200 to 2000 nm.

31. The photovoltaic structure according to any of embodiments 1-30, wherein the second composite conductor has a transmittance of at least 90% in a wavelength range of 525 to 575 nm.

32. The photovoltaic structure according to any of embodiments 1-31, wherein the second composite conductor has a transmittance of at least 95% in a wavelength range of 525 to 575 nm.

33. The photovoltaic structure according to any embodiments 1-32, wherein the first conducting layer includes a first transparent conductive oxide.

34. The photovoltaic structure of embodiment 33, wherein the first transparent conductive oxide includes ITO or AZO.

35. The photovoltaic structure according to any of embodiments 1-34, wherein the first conducting layer has an average thickness of less than 100 nm.

36. The photovoltaic structure according to any embodiments 1-35, wherein the second conducting layer includes a second transparent conductive oxide.

37. The photovoltaic structure of embodiment 36, wherein the second transparent conductive oxide includes ITO or AZO.

38. The photovoltaic structure according to any of embodiments 1-37, wherein the second conducting layer has an average thickness of less than 100 nm.
39. The photovoltaic structure according to any of embodiments 1-38, wherein i) the first set of metal lines are formed from a first metal ink including first metal particles characterized by a first average metal particle size, ii) the second set of metal lines are formed from a second metal ink including second metal particles characterized by a second average metal particle size, and iii) the first average metal particle size is less than the second average metal particle size.
40. The photovoltaic structure according to any of embodiments 1-39, wherein the first set of metal lines include silver or copper.
41. The photovoltaic structure according to any of embodiments 1-40, wherein the second set of metal lines include silver or copper.
42. The photovoltaic structure according to any of embodiments 1-39, wherein the first set of metal lines includes silver and the second set of metal lines includes copper.
43. The photovoltaic structure according to any of embodiments 1-42, wherein the first set of metal lines are at least partially embedded in the substrate.
44. The photovoltaic structure according to any of embodiments 1-43, wherein the substrate is flexible.
45. The photovoltaic structure according to any of embodiments 1-44, wherein the substrate includes glass.
46. The photovoltaic structure of embodiments 45, wherein the glass has a thickness in a range of 50 to 350 µm.
47. The photovoltaic structure according to any of embodiments 1-44, wherein the substrate includes a polymer film.
48. The photovoltaic structure of embodiment 47, wherein the polymer film has a thickness in a range of 20 to 200 µm.
49. The photovoltaic structure of embodiment 47 or 48, wherein the polymer film includes PET.
50. The photovoltaic structure according to any of embodiments 1-49, further including an adhesion layer provided over the second composite conductor.
51. The photovoltaic structure of embodiment 50, wherein the adhesion layer functions as an encapsulation layer.
52. The photovoltaic structure of embodiment 50 or 51, wherein the adhesion layer includes a thermoplastic polyolefin.
53. The photovoltaic structure according to any of embodiments 50-52, further including a superstrate provided over the adhesion layer.
54. The photovoltaic structure of embodiment 53, wherein the superstrate includes glass.
55. The photovoltaic structure of embodiment 53 or 54, wherein the superstrate is a window.
56. The photovoltaic structure according to any of embodiments 1-55, wherein one of the carrier transport layers includes an electron transporting material and the other carrier transport layer includes a hole transporting material.
57. The photovoltaic structure of embodiment 56, wherein the electron transporting material includes tin oxide.
58. The photovoltaic structure of embodiment 56 or 57, wherein the hole transporting material includes nickel oxide.
59. The photovoltaic structure according to any of embodiments 56-58, wherein the first carrier transport layer includes the electron transporting material.
60. The photovoltaic structure according to any of embodiments 56-58, wherein the first carrier transport layer includes the hole transporting material.
61. The photovoltaic structure according to any of embodiments 1-60, wherein the perovskite absorber layer includes an alkylammonium lead iodide.
62. A photovoltaic module including a plurality of photovoltaic cells, wherein one or more of the plurality of photovoltaic cells includes an independently-selected photovoltaic structure according to any of embodiments 1-61.
63. The photovoltaic module of embodiments 62, wherein the photovoltaic cells are connected in series.
64. A method of making a photovoltaic structure, the method including:
conveying a substrate from a substrate station to a first metal lines station;
printing a first set of parallel metal lines onto the substrate, wherein the parallel metal lines are oriented in a direction substantially orthogonal to a substrate conveyance direction; and
conveying the substrate to a first conductive layer station and depositing a first conductive layer over the first set of metal lines to form a first composite conductor, wherein the first conductive layer includes a first transparent conductive oxide.
65. The method of embodiment 64, wherein depositing the first conductive layer includes depositing an aerosol of the first transparent conductive oxide.
66. The method of embodiments 64 or 65, further including conveying the substrate to a first carrier transport station and depositing a first carrier transport layer over the first composite conductor.
67. The method of embodiment 66, further including conveying the substrate to a perovskite absorbing layer station and depositing a perovskite absorbing layer over the first carrier transport layer.
68. The method of embodiment 67, further including conveying the substrate to a second carrier transport station and depositing a second carrier transport layer over the perovskite absorber layer.
69. The method of embodiment 68, further including conveying the substrate to a second conducting layer station and depositing a second conducting layer over the perovskite absorber layer, wherein the second conductive layer includes a second transparent conductive oxide.
70. The method of embodiment 69, wherein depositing the second conductive layer includes depositing an aerosol of the second transparent conductive oxide.
71. The method of embodiment 69 or 70, further including conveying the substrate to a second metal lines station and printing a second set of parallel metal lines onto the second conducting layer to form a second composite conductor, wherein the second set of parallel metal lines are oriented in a direction substantially orthogonal to the substrate conveyance direction.
72. The method according to any of embodiments 64-71, wherein printing the first set of parallel metal lines includes flexographic printing.
73. The method of embodiment 71 or 72, wherein the printing of the second set of parallel metal lines includes flexographic printing.

74. The method according to any of embodiments 64-73, wherein the substrate is a flexible substrate conveyed in a roll-to-roll manufacturing apparatus to each station.

75. The method according to any of embodiments 64-74, wherein the photovoltaic structure is a bifacial photovoltaic structure according to any of embodiments 1-61.

76. A photovoltaic structure including:
a) a transparent substrate;
b) a transparent first composite conductor overlaying the transparent substrate, the first composite conductor including (i) a first set of metal lines provided over the transparent substrate, the first set of metal lines has an average height of less than 150 nm, and (ii) a first conducting layer provided over the first set of metal lines and over the transparent substrate, wherein the first conducting layer includes a first transparent conductive oxide and has an average thickness of less than 100 nm;
c) a perovskite absorbing layer provided over the first composite conductor; and
d) a second electrode provided over the perovskite absorbing layer.

77. The photovoltaic structure of embodiment 76, wherein the first set of metal lines has an average thickness of at least 20 nm and the first transparent conductive oxide has an average thickness of at least 30 nm.

78. The photovoltaic structure of embodiment 76 or 77, wherein the first set of metal lines includes silver.

79. The photovoltaic structure of embodiment 78, wherein the first set of metal lines is formed by flexographic printing of a silver ink.

80. The photovoltaic structure according to any of embodiments 76-79, wherein the first conducting layer includes ITO or IZO.

81. The photovoltaic structure of embodiment 80, wherein the first conducting layer is formed by aerosol deposition.

82. The photovoltaic structure according to any of embodiments 76-81, further including a first carrier transport layer disposed between the first conducting layer and the perovskite absorbing layer.

83. The photovoltaic structure according to any of embodiments 76-82, further including a second carrier transport layer disposed between the perovskite absorbing layer and the second electrode.

84. The photovoltaic structure according to any of embodiments 76-83, wherein the transparent substrate is flexible.

85. The photovoltaic structure according to any of embodiments 76-84, wherein the transparent substrate includes PET.

86. The photovoltaic structure according to any of embodiments 76-84, wherein the transparent substrate includes glass.

87. The photovoltaic structure according to any of embodiments 76-86, wherein the transparent substrate includes a modified surface.

88. The photovoltaic structure according to any of embodiments 76-87, wherein the first set of metal lines as an average width W1 of less than 40 μm.

89. The photovoltaic structure according to any of embodiments 76-88, wherein the first composite conductor has a % T of at least 80% in a wavelength range of 525 to 575 nm.

90. The photovoltaic structure according to any of embodiments 76-89, wherein the first composite conductor has a functional sheet resistance of less than 30 Ω.

91. The photovoltaic structure according to any of embodiments 76-90, wherein the first set of metal lines include substantially parallel lines that align with the direction of intended current flow during device operation.

92. The photovoltaic structure according to any of embodiments 76-91, wherein the first set of metal lines does not include a crossed-line grid structure.

93. A method of making a transparent first composite conductor, the method including:
a) flexographically printing a first set of metal lines over a flexible transparent substrate using a silver ink;
b) heating the silver ink in a range of 100 to 180° C.; and
c) coating by aerosol deposition a conducting layer including ITO or IZO over the metal lines,
wherein:
  i) the metal lines have an average width W1 of less than 40 μm and an average height of less than 150 nm;
  ii) the conducting layer has an average thickness in a range of 30-150 nm; and
  iii) the composite conductor has a % T of at least 80% in a wavelength range of 525 to 575 nm.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of example embodiments of the invention has been presented for the purposes of illustration and description. It is not intended to be exhaustive or to limit the invention to the precise form described, and many modifications and variations are possible in light of the teaching above.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Additionally, details of any specific embodiment may not always be present in variations of that embodiment or may be added to other embodiments. It should be noted that, unless otherwise explicitly noted or required by context, the word "or" is used in this disclosure in a non-exclusive sense.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the device" includes reference to one or more devices and equivalents thereof known to those skilled in the art, and so forth. The invention has now been described in detail for the purposes of clarity and understanding. However, it will be appreciated that certain changes and modifications may be practice within the scope of the appended claims.

All publications, patents, and patent applications cited herein are hereby incorporated by reference in their entirety for all purposes. None is admitted to be prior art.

We claim:

1. A bifacial photovoltaic structure comprising:
   a) a transparent substrate;
   b) a transparent first composite conductor overlaying the transparent substrate, the first composite conductor comprising a first set of metal lines and a first conducting layer provided in contact with the first set of metal lines, wherein the first set of metal lines is characterized by a first set of dimensions and a first metallic composition;
   c) a first carrier transport layer overlaying the first composite conductor
   d) a perovskite absorber layer overlaying the first carrier transport layer;
   e) a second carrier transport layer overlaying the perovskite absorber layer; and
   f) a transparent second composite conductor overlaying the second carrier transport layer, the second composite conductor comprising a second conducting layer and a second set of metal lines provided in contact with the second conducting layer, wherein the second set of metal lines is characterized by a second set of dimensions and a second metallic composition,
   wherein:
   i) at least one dimension of the first set of dimensions is different than a corresponding dimension of the second set of dimensions by greater than 20%;
   ii) the first metallic composition is different than the second metallic composition with respect to elemental composition or morphology; or
   iii) both i) and ii);
   and wherein at least one of the first and second composite conductors has a functional sheet resistance of less than 20 ohms.

2. The bifacial photovoltaic structure of claim 1, wherein the first set of metal lines is provided over the transparent substrate and the first conducting layer is provided over the first set of metal lines and over the transparent substrate.

3. The photovoltaic structure of claim 2, wherein the second conducting layer is provided over the second carrier transport layer and the second set of metal lines is provided over the second conducting layer.

4. The photovoltaic structure of claim 1, wherein within a target wavelength range and relative to the second composite conductor, the first composite conductor has a higher average transmittance or a lower average absorptance.

5. The photovoltaic structure of claim 1, wherein the first set of metal lines have an average width W1 that is larger than an average width W2 of the second set of metal lines.

6. The photovoltaic structure according of claim 1, wherein the first set of metal lines have an average height H1 that is smaller than an average height H2 of the second set of metal lines.

7. The photovoltaic structure of claim 1, wherein the first set of metal lines, the second set of metal lines, or both the first and second sets of metal lines comprise substantially parallel lines that align with an intended direction of current flow during operation.

8. The photovoltaic structure of claim 7, wherein the substantially parallel lines are uniformly spaced by an average distance of 0.1 to 2.0 mm.

9. The photovoltaic structure of claim 1, wherein the substrate is flexible.

10. The photovoltaic of claim 1, wherein the first composite conductor is characterized by a first functional sheet resistance, the second composite conductor is characterized by a second functional sheet resistance, and a ratio of the first functional sheet resistance to the second functional sheet resistance is in a range of 0.5 to 2.0.

11. The photovoltaic structure of claim 1, wherein at least one of the first and second conducting layers has an intrinsic sheet resistance in a range of 200 to 1000 ohms/square.

12. The photovoltaic structure of claim 1, wherein i) the first set of metal lines has an average width W1 of less than 40 μm, ii) the second set of metal lines has an average width W2 of less than 20 μm, iii) the first set of metal lines has an average height H1 in a range of 50 to 200 nm, iv) the second set of metal lines has an average height H2 in a range of 200 to 2000 nm, or v) any combination of (i)-(iv).

13. The photovoltaic structure of claim 1, wherein the second composite conductor has a transmittance of at least 90% or an absorptance of less than 10% in a wavelength range of 525 to 575 nm.

14. The photovoltaic structure of claim 1, wherein the first conducting layer comprises a first transparent conductive oxide having an average thickness of 100 nm or less.

15. The photovoltaic structure of claim 1, wherein the second conducting layer comprises a second transparent conductive oxide having an average thickness of 100 nm or less.

16. The photovoltaic structure of claim 1, wherein i) the first set of metal lines are formed from a first metal ink wherein the first metal ink comprises first metal particles characterized by a first average metal particle size, ii) the second set of metal lines are formed from a second metal ink wherein the second metal ink comprises second metal particles characterized by a second average metal particle size, and iii) the first average metal particle size is less than the second average metal particle size.

17. The photovoltaic structure of claim 1, wherein the first set of metal lines comprise silver, and wherein the second set of metal lines comprise copper.

18. The photovoltaic structure of claim 1, wherein the first set of metal lines are at least partially embedded in the substrate.

19. A bifacial photovoltaic structure comprising:
   a) a transparent substrate;
   b) a transparent first composite conductor overlaying the transparent substrate, the first composite conductor comprising a first set of metal lines and a first conducting layer provided in contact with the first set of metal lines, wherein the first set of metal lines is characterized by a first set of dimensions and a first metallic composition;
   c) a first carrier transport layer overlaying the first composite conductor d) a perovskite absorber layer overlaying the first carrier transport layer;
e) a second carrier transport layer overlaying the perovskite absorber layer; and
f) a transparent second composite conductor overlaying the second carrier transport layer, the second composite conductor comprising a second conducting layer and a second set of metal lines provided in contact with the second conducting layer, wherein the second set of metal lines is characterized by a second set of dimensions and a second metallic composition, wherein:

i) at least one dimension of the first set of dimensions is different than a corresponding dimension of the second set of dimensions by greater than 20%;
ii) the first metallic composition is different than the second metallic composition with respect to elemental composition or morphology; or
iii) both i) and ii);

and wherein the first composite conductor is characterized by a first functional sheet resistance, the second composite conductor is characterized by a second functional sheet resistance, and a ratio of the first functional sheet resistance to the second functional sheet resistance is in a range of 0.5 to 2.0.

* * * * *